United States Patent (10) Patent No.: US 12,557,601 B2
Kuboi et al. (45) Date of Patent: Feb. 17, 2026

(54) DEFECT DENSITY CALCULATION METHOD, DEFECT-DENSITY CALCULATION PROGRAM, DEFECT-DENSITY CALCULATION APPARATUS, HEAT TREATMENT CONTROL SYSTEM AND MACHINING CONTROL SYSTEM

(71) Applicant: Sony Semiconductor Solutions Corporation, Kanagawa (JP)

(72) Inventors: Nobuyuki Kuboi, Kanagawa (JP); Koji Eriguchi, Kyoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1144 days.

(21) Appl. No.: 17/608,004

(22) PCT Filed: Apr. 23, 2020

(86) PCT No.: PCT/JP2020/017456
§ 371 (c)(1),
(2) Date: Nov. 1, 2021

(87) PCT Pub. No.: WO2020/226064
PCT Pub. Date: Nov. 12, 2020

(65) Prior Publication Data
US 2022/0189833 A1 Jun. 16, 2022

(30) Foreign Application Priority Data
May 7, 2019 (JP) .................................. 2019-087455

(51) Int. Cl.
*H01L 21/66* (2006.01)
(52) U.S. Cl.
CPC .................................. *H01L 22/20* (2013.01)

(58) Field of Classification Search
CPC ......... H01L 22/20; H01L 22/12; H01L 21/00; G06F 2119/18; G06F 30/398; G06F 30/23; G06F 30/39
See application file for complete search history.

(56) References Cited

U.S. PATENT DOCUMENTS

| 5,485,803 | A  | * | 1/1996 | Habu | ....................... | C30B 33/00 |
| | | | | | | 117/14 |
| 2011/0025839 | A1 | * | 2/2011 | Trupke | ..................... | H10F 71/00 |
| | | | | | | 348/87 |

FOREIGN PATENT DOCUMENTS

| JP | 60074535 A | * | 4/1985 | ......... H01L 21/3221 |
| JP | H11-147789 A | | 6/1999 | |

(Continued)

OTHER PUBLICATIONS

International Search Report (PCT/ISA/210), International Application No. PCT/JP2020/017456, dated Jul. 6, 2020.

*Primary Examiner* — Rehana Perveen
*Assistant Examiner* — Troy A Maust
(74) *Attorney, Agent, or Firm* — Michael Best & Friedrich LLP

(57) ABSTRACT

A defect density calculation method according to one embodiment of the present disclosure is a method of calculating a temporal change of the defect density distribution in a semiconductor layer. The method includes calculating the temporal change of the defect density distribution on the basis of an arithmetic function using at least the activation energy of a detect included in the semiconductor layer, the processing temperature of the semiconductor layer, and the processing time of the semiconductor layer as arguments.

13 Claims, 16 Drawing Sheets

(56) References Cited

FOREIGN PATENT DOCUMENTS

| JP | 2003-073192 A | 3/2003 |
|----|---------------|--------|
| JP | 2010-083712 A | 4/2010 |
| JP | 2017-126632 A | 7/2017 |
| JP | 2019-047068 A | 3/2019 |

* cited by examiner

[ FIG. 1 ]
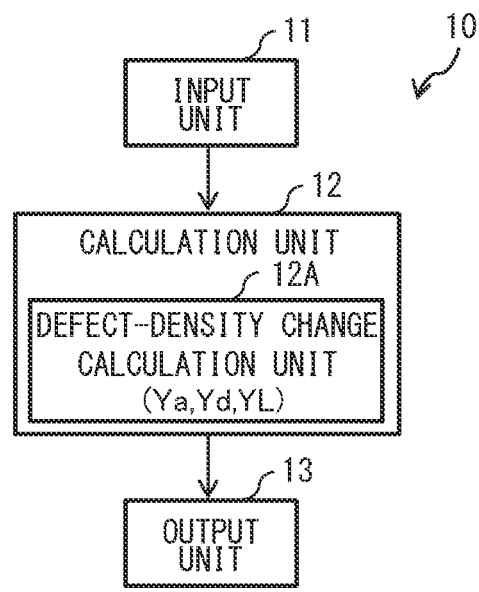
[ FIG. 2 ]
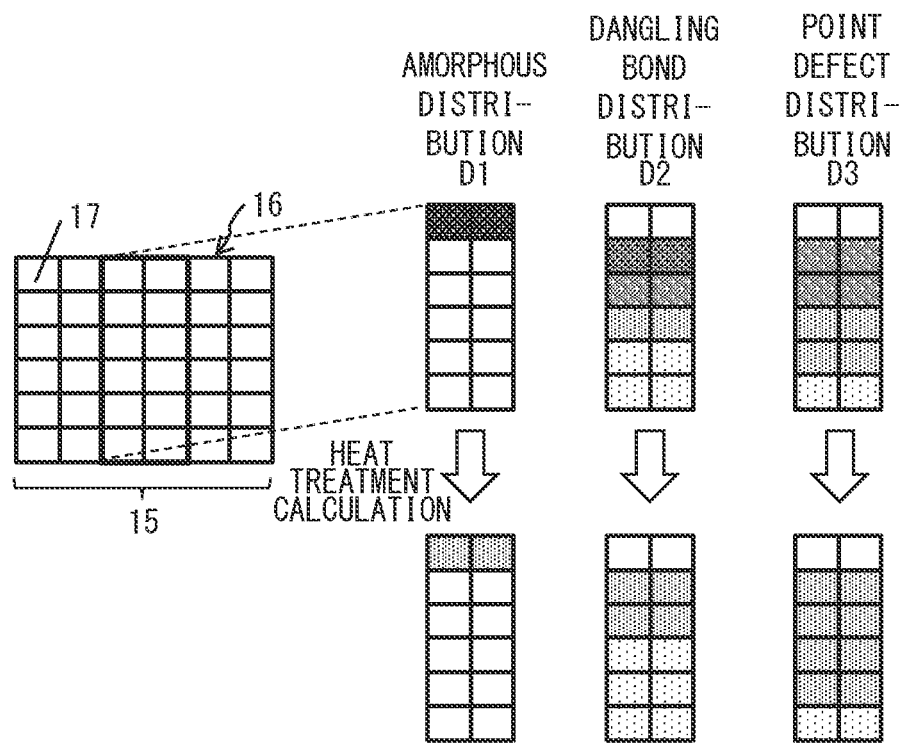

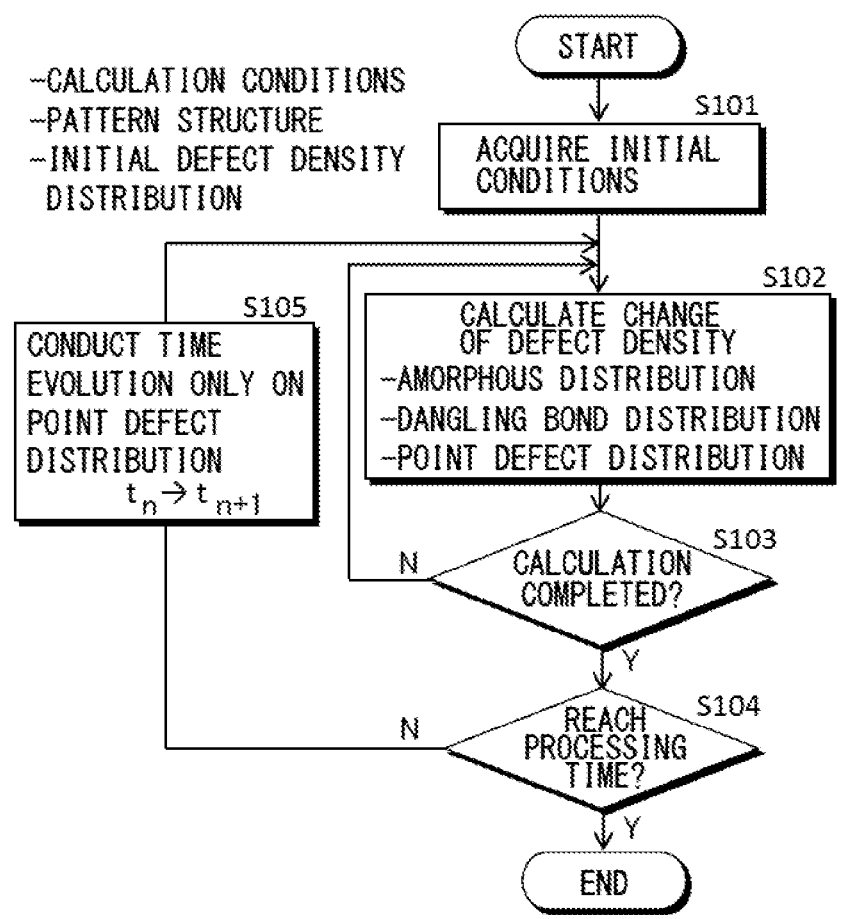
[FIG. 3]

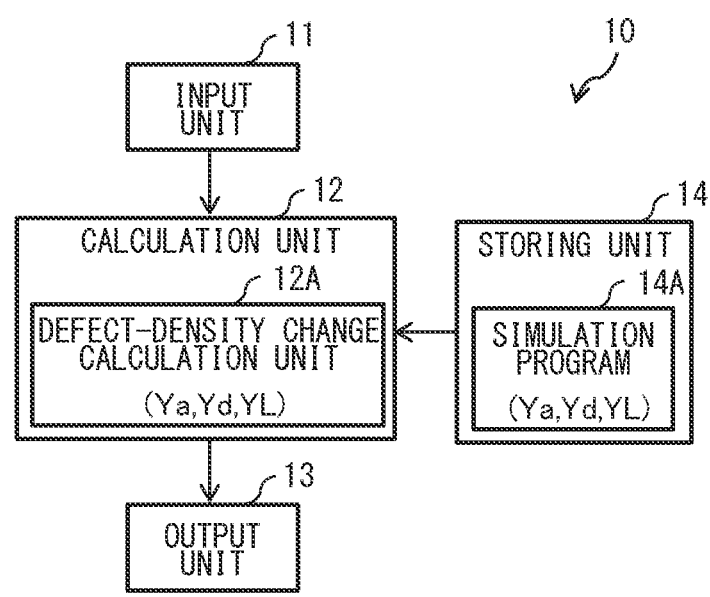
[FIG. 4]

[FIG. 5]
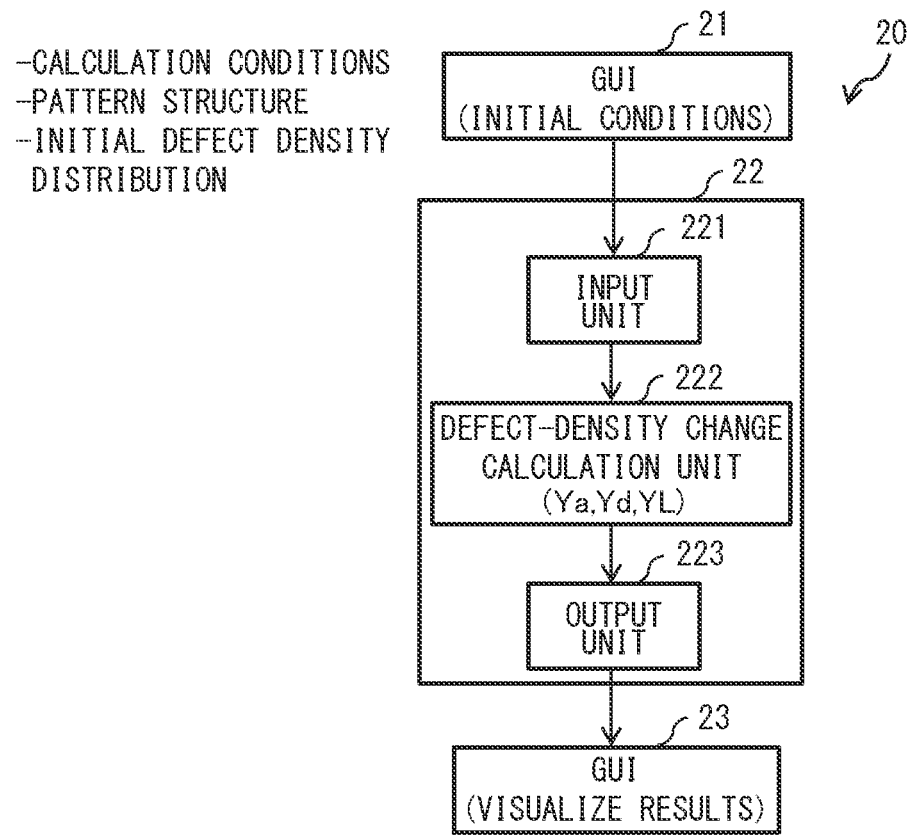

[FIG. 6]
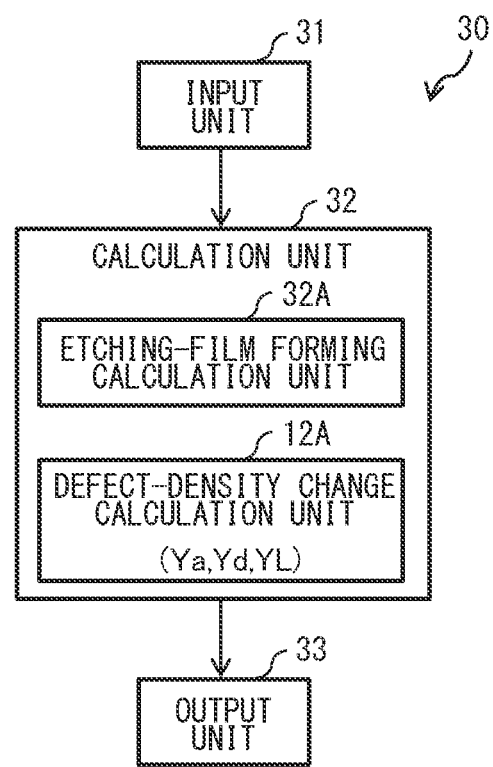

[ FIG. 7 ]
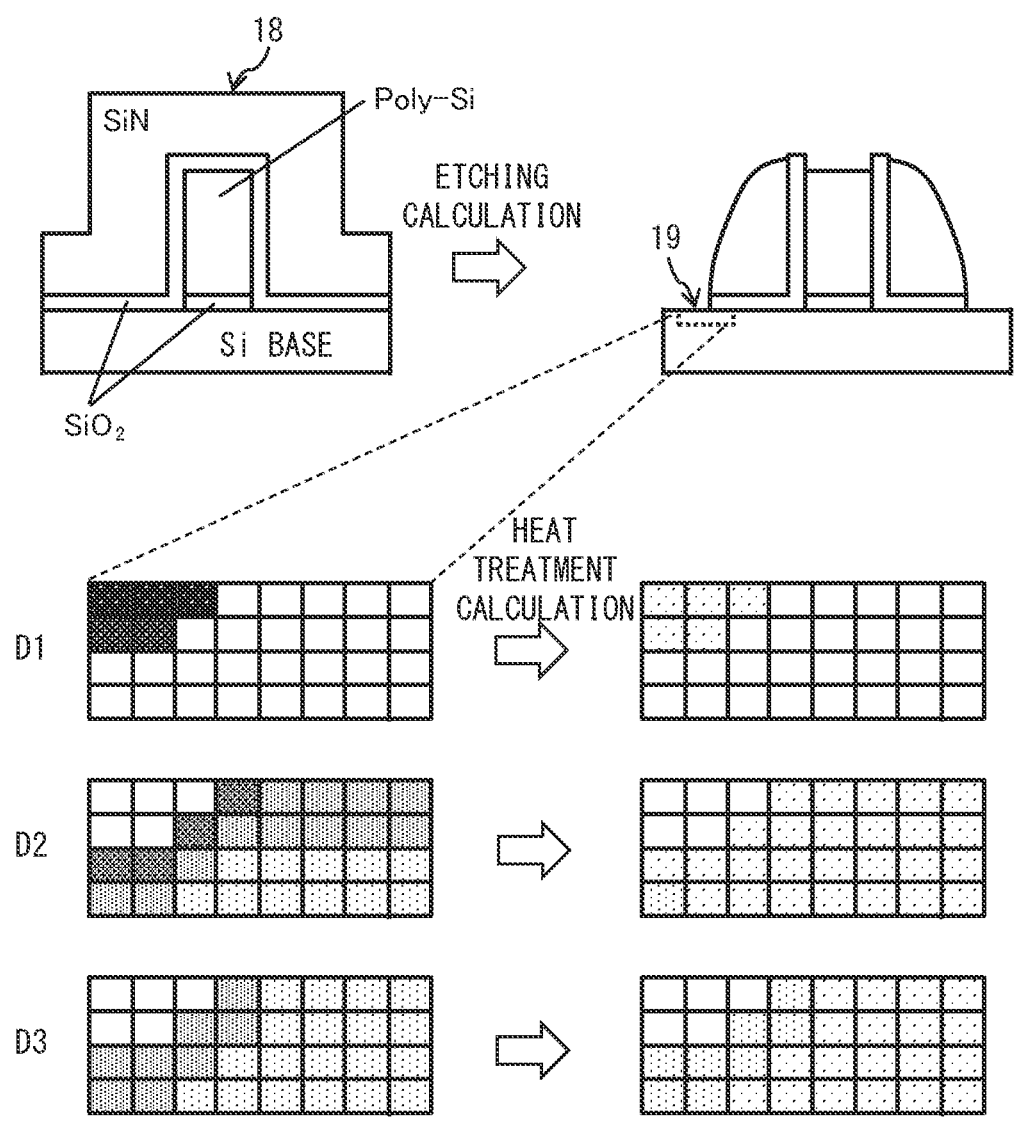

[ FIG. 8 ]
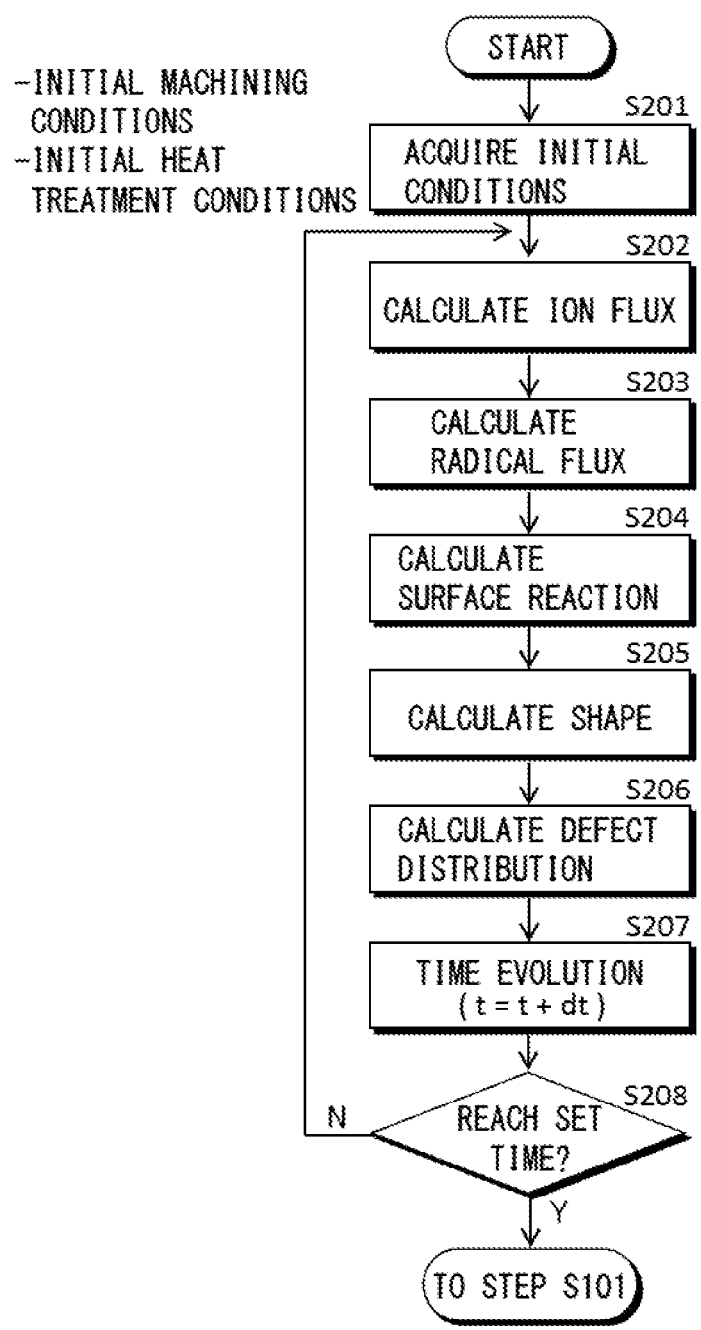

[ FIG. 9 ]
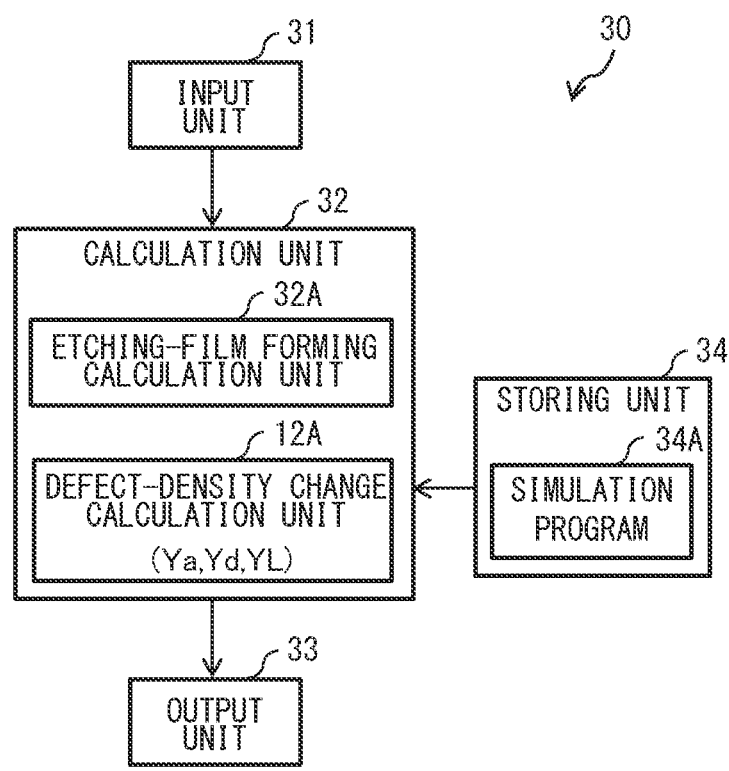

[ FIG. 10 ]
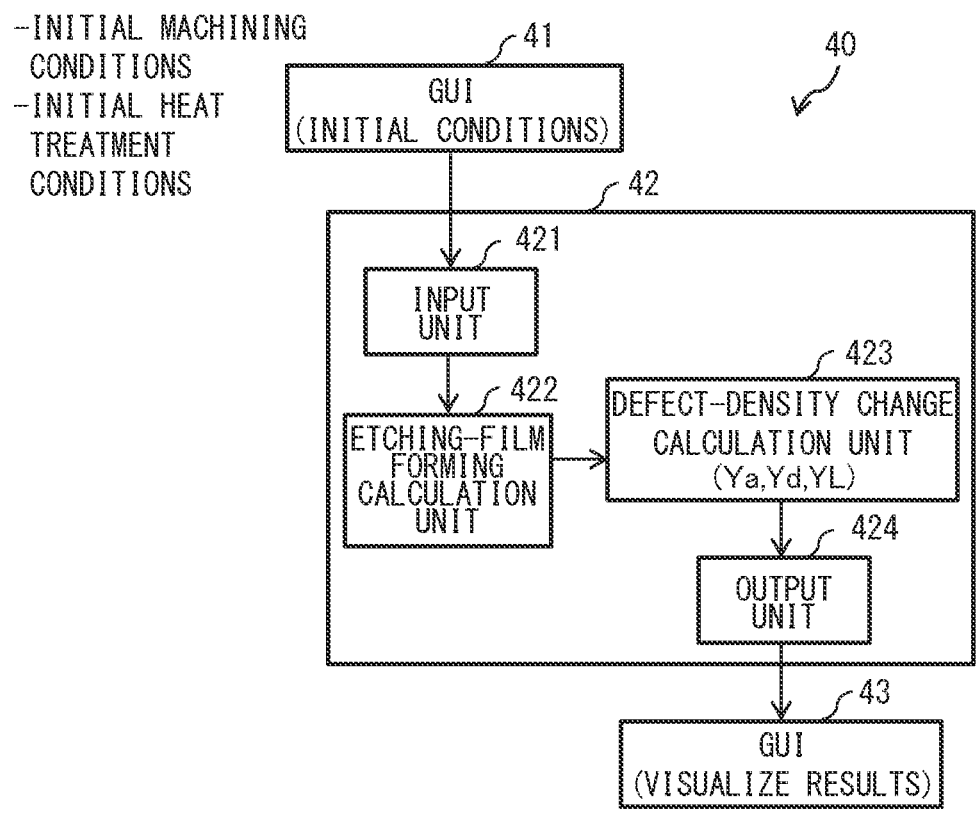

[FIG. 11]
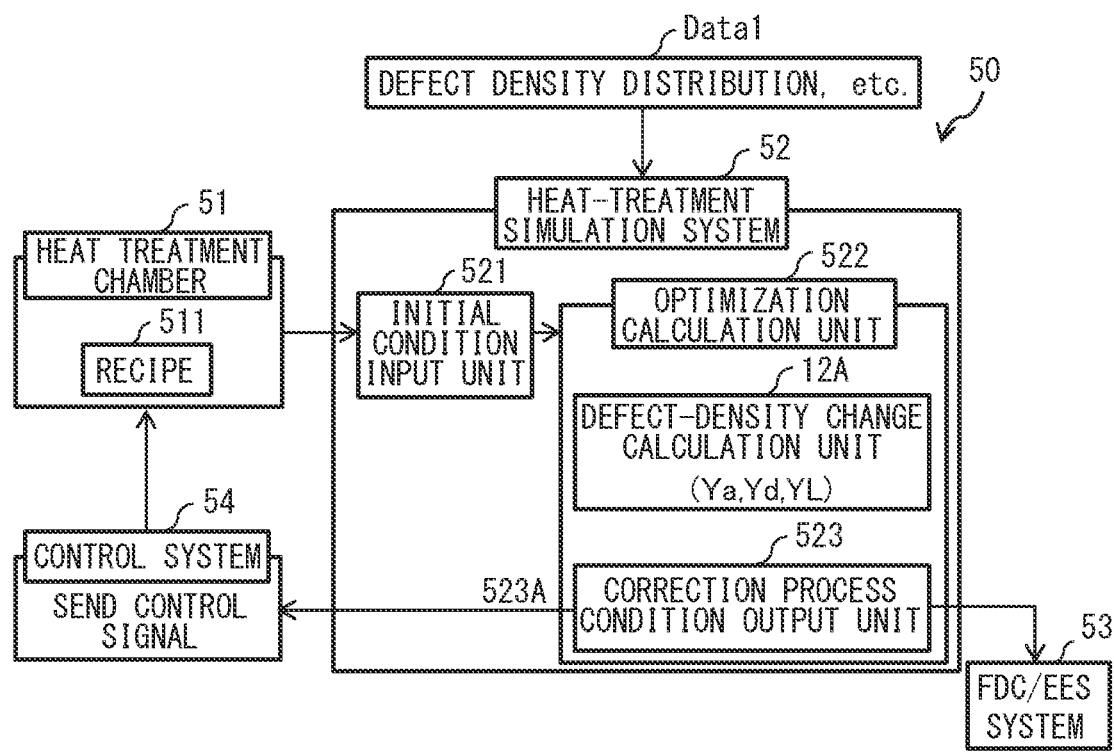

[FIG. 12]
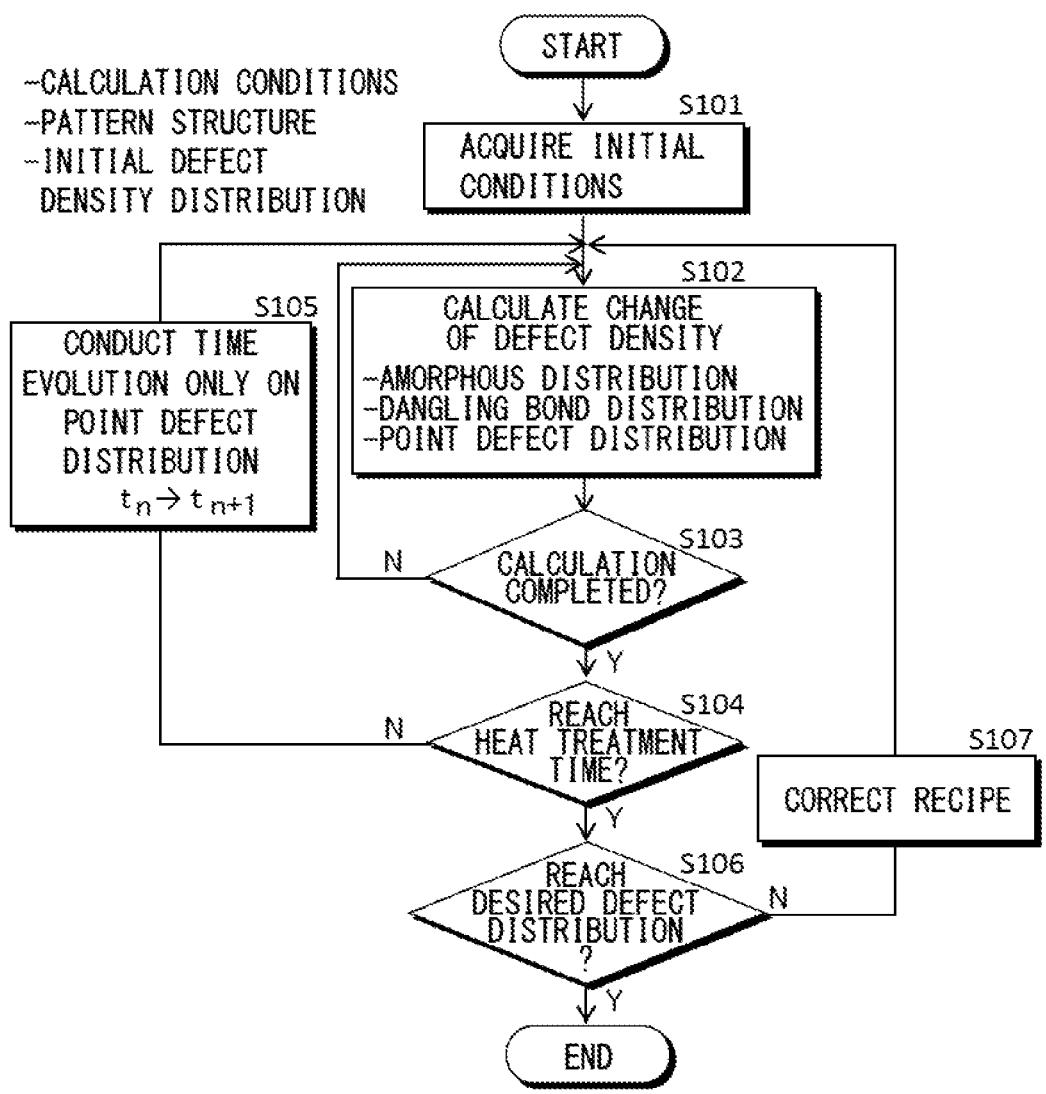

[ FIG. 13 ]
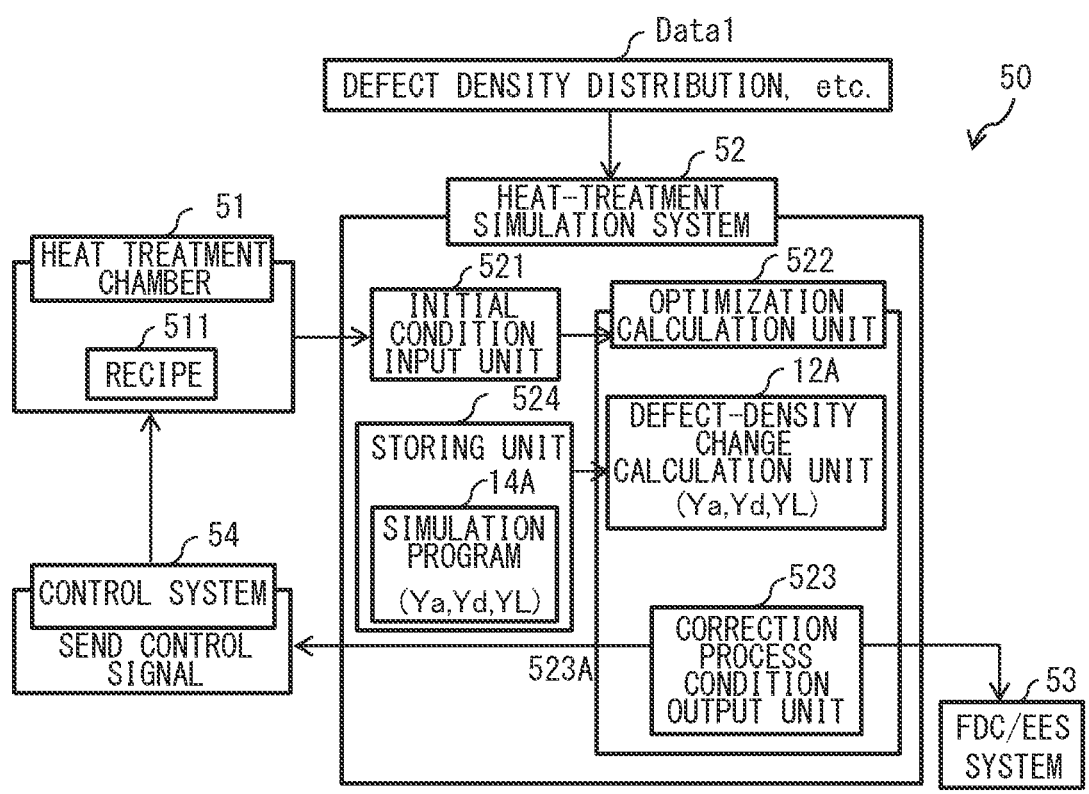

[ FIG. 14 ]
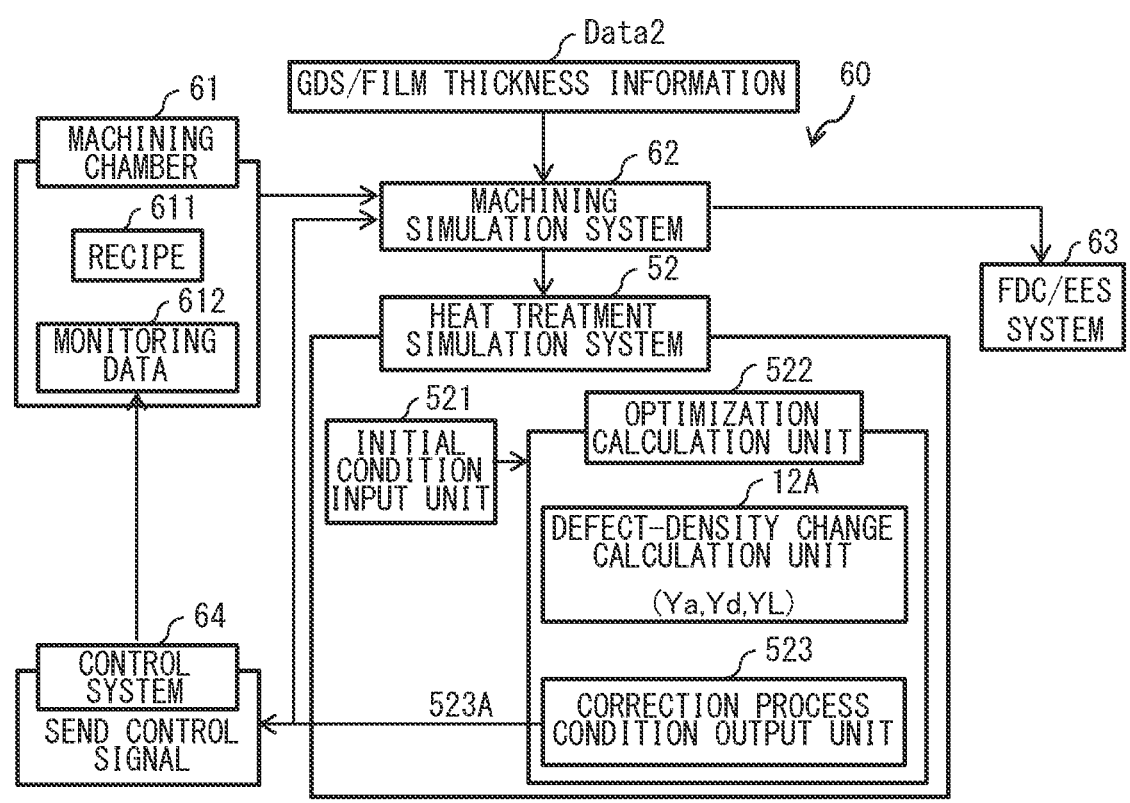

[FIG. 15]
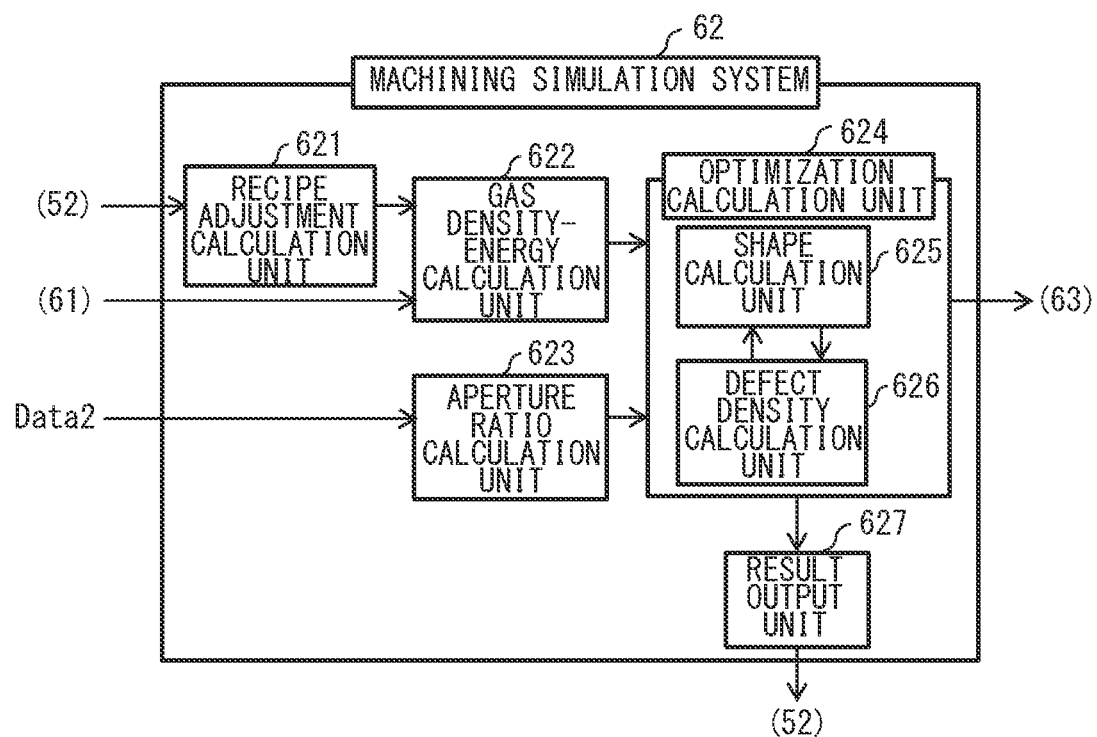

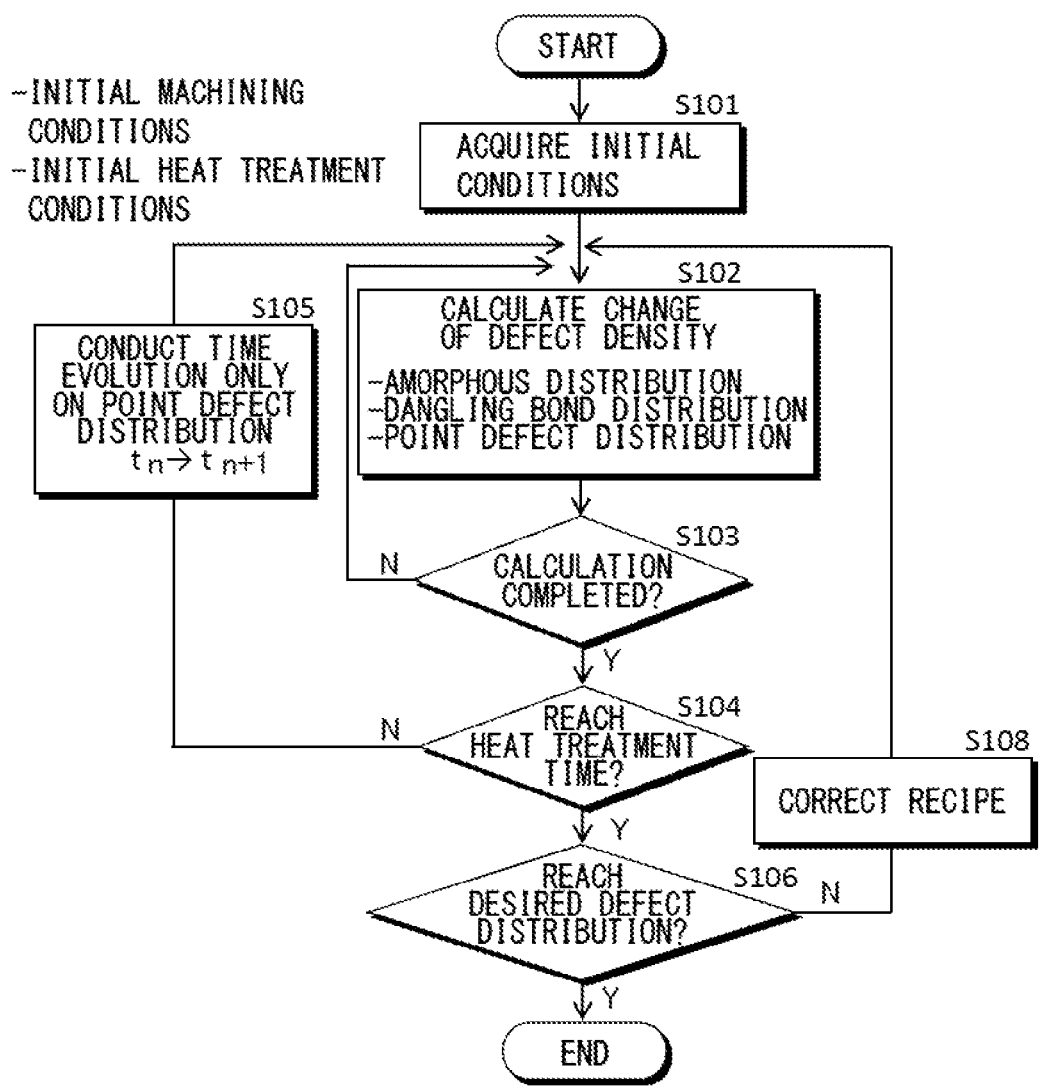
[FIG. 16]

[FIG. 17]
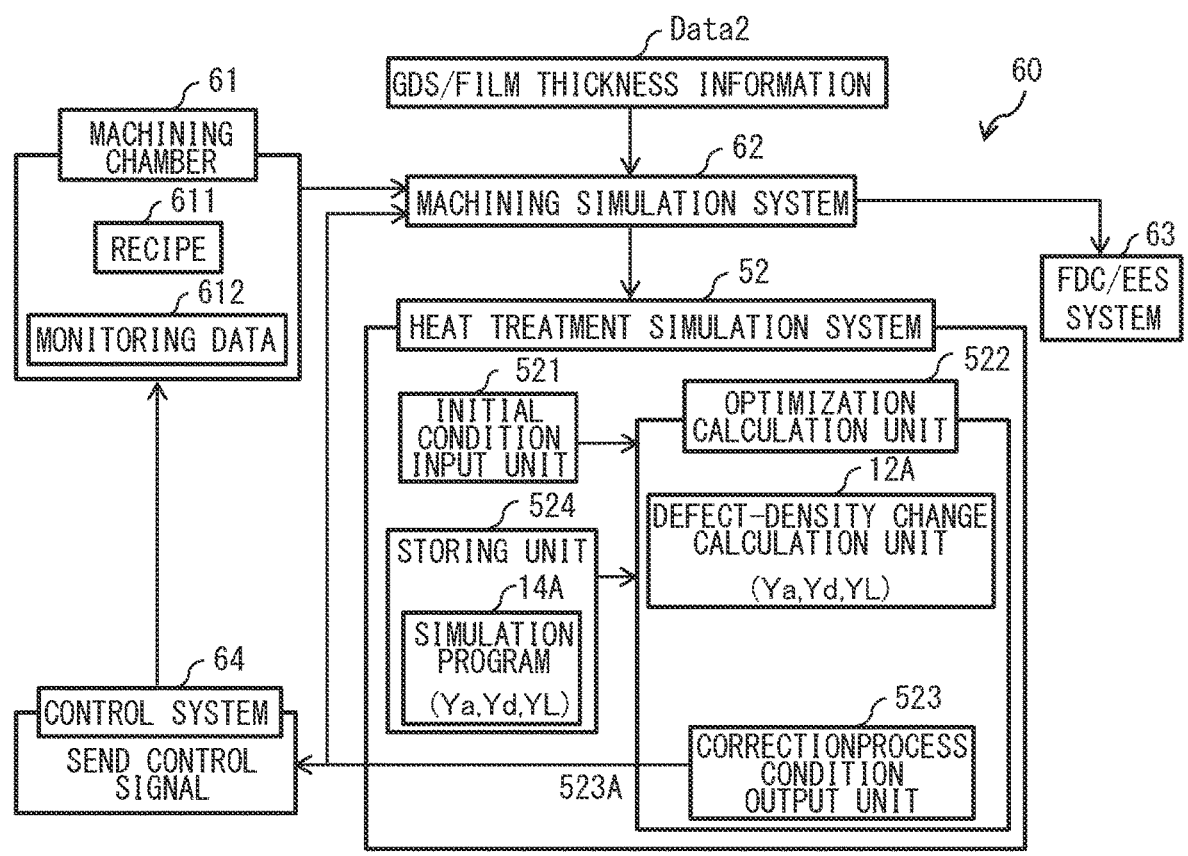

DEFECT DENSITY CALCULATION METHOD, DEFECT-DENSITY CALCULATION PROGRAM, DEFECT-DENSITY CALCULATION APPARATUS, HEAT TREATMENT CONTROL SYSTEM AND MACHINING CONTROL SYSTEM

TECHNICAL FIELD

The present disclosure relates to a defect density calculation method, a defect-density calculation program, a defect-density calculation apparatus, a heat treatment control system and a machining control system.

BACKGROUND

In semiconductor processing, a step of applying heat, such as annealing treatment, is performed to reduce crystal defects. Thus, knowing the crystal defect distribution after heat treatment is particularly important because the crystal defect distribution is directly related to device characteristics. However, it is often difficult to measure and analyze a detailed distribution of crystal defects (particularly, low-density defects) in actual processes and actual devices in terms of sensitivity, etc. Thus, one effective measure is to predict the crystal defect distribution by simulation (see PTL 1, for example).

CITATION LIST

Patent Literature

PTL 1: Japanese Unexamined Patent Application Publication No. 2003-073192

SUMMARY OF THE INVENTION

However, in a case where the crystal defect distribution is predicted by simulation, it is difficult to predict the crystal defect distribution in an actual pattern size within realistic calculation time by the simulation. It is desirable to provide a defect density calculation method, a defect-density calculation program, a defect-density calculation apparatus, a heat treatment control system, and a machining control system making it possible to predict the crystal defect distribution in an actual pattern size within realistic calculation time.

A defect density calculation method according to one embodiment of the present disclosure is a method of calculating a temporal change of the defect density distribution in a semiconductor layer. The method includes calculating the temporal change of the defect density distribution on the basis of an arithmetic function using at least the activation energy of a defect included in the semiconductor layer, the processing temperature of the semiconductor layer, and the processing time of the semiconductor layer as arguments.

A defect-density calculation program according to one embodiment of the present disclosure is a program that calculates a temporal change of the defect density distribution in a semiconductor layer. The program causes a computer to calculate the temporal change of the defect density distribution on the basis of an arithmetic function using at least the activation energy of a defect included in the semiconductor layer, the processing temperature of the semiconductor layer, and the processing time of the semiconductor layer as arguments.

A defect-density calculation apparatus according to one embodiment of the present disclosure is an apparatus that calculates a temporal change of the defect density distribution in a semiconductor layer. The apparatus includes a storing unit and a calculation unit. The storing unit stores an arithmetic function using at least the activation energy of a defect included in the semiconductor layer, the processing temperature of the semiconductor layer, and the processing time of the semiconductor layer as arguments. The calculation unit calculates the temporal change of the defect density distribution on the basis of an output value of the arithmetic function obtained by assigning the activation energy, the processing temperature, and the processing time to the arithmetic function read from the storing unit depending on an elapse of the processing time.

A heat treatment control system according to one embodiment of the present disclosure includes a heat treatment unit that conducts heat treatment on a semiconductor layer, a control unit that controls the heat treatment unit, and a defect density change calculation unit. The defect density change calculation unit includes a calculation unit and a condition generating unit. The calculation unit calculates a temporal change of the defect density distribution on the basis of an arithmetic function using at least the activation energy of a defect included in the semiconductor layer, the processing temperature of the semiconductor layer, and the processing time of the semiconductor layer as arguments. The condition generating unit generates a heat treatment condition for the heat treatment unit on the basis of the defect density distribution obtained by the calculation unit and a desired defect density distribution. The heat treatment unit conducts the heat treatment on the semiconductor layer on the basis of the heat treatment condition generated by the condition generating unit.

A machining control system according to one embodiment of the present disclosure includes a machining unit that processes a semiconductor layer, a control unit that controls the machining unit, a defect density calculation unit, and a defect density change calculation unit. The defect density calculation unit calculates a defect density distribution in the semiconductor layer generated when the machining unit processes the semiconductor layer, and outputs the defect density distribution obtained thereby to the defect density change calculation unit. The defect density change calculation unit includes a calculation unit and a condition generating unit. The calculation unit calculates a temporal change of the defect density distribution received from the defect density calculation unit on the basis of an arithmetic function using at least the activation energy of a defect included in the semiconductor layer, the processing temperature of the semiconductor layer, and the processing time of the semiconductor layer as arguments. The condition generating unit generates a heat treatment condition for the heat treatment unit on the basis of the defect density distribution obtained by the calculation unit and a desired defect density distribution. The machining unit processes the semiconductor layer on the basis of the machining condition generated by the condition generating unit.

In the defect density calculation method, the defect-density calculation program, the defect-density calculation apparatus, the heat treatment control system, and the machining control system according to one embodiment of the present disclosure, the temporal change of the defect density distribution is calculated on the basis of an arithmetic function using at least the activation energy of the defect included in the semiconductor layer, the processing temperature of the semiconductor layer, and the processing time of the semiconductor layer as arguments. This makes it possible to predict the crystal defect distribution in an actual pattern size within realistic calculation time. Further, because the crystal defect distribution is able to be calculated in the actual pattern size, it is possible to accurately predict the transistor characteristics and the pixel characteristics in view of the process conditions and the variations of the conditions by using the crystal defect distribution obtained through the prediction as an input of the device simulation, for example.

BRIEF DESCRIPTION OF DRAWINGS

FIG. 1 is a diagram illustrating an exemplary schematic configuration of a simulator according to a first embodiment of the present disclosure.

FIG. 2 is a diagram illustrating an exemplary calculation model in the simulator of FIG. 1.

FIG. 3 is a diagram illustrating an exemplary procedure performed by the simulator of FIG. 1 to predict a change in the crystal defect density.

FIG. 4 is a diagram illustrating a modification example of the schematic configuration of the simulator of FIG. 1.

FIG. 5 is a diagram illustrating an exemplary schematic configuration of simulation software including the procedure of FIG. 3.

FIG. 6 is a diagram illustrating an exemplary schematic configuration of a simulator according to a second embodiment of the present disclosure.

FIG. 7 is a diagram illustrating an exemplary calculation model in the simulator of FIG. 6.

FIG. 8 is a diagram illustrating an exemplary procedure performed by the simulator of FIG. 6 to predict the crystal defect density and a change in the crystal defect density.

FIG. 9 is a diagram illustrating a modification example of the schematic configuration of the simulator of FIG. 6.

FIG. 10 is a diagram illustrating an exemplary schematic configuration of simulation software including the procedure of FIG. 8.

FIG. 11 is a diagram illustrating an exemplary schematic configuration of a heat treatment control system according to a third embodiment of the present disclosure.

FIG. 12 is a diagram illustrating an exemplary procedure for optimizing the heating conditions for a semiconductor layer to be heated in a heat treatment chamber in the heat treatment control system of FIG. 11.

FIG. 13 is a diagram illustrating a modification example of the schematic configuration of the heat treatment control system of FIG. 11.

FIG. 14 is a diagram illustrating an exemplary schematic configuration of a machining control system according to a fourth embodiment of the present disclosure.

FIG. 15 is a diagram illustrating an exemplary schematic configuration of a machining simulation system of FIG. 14.

FIG. 16 is a diagram illustrating an exemplary procedure for optimizing the machining condition for a semiconductor layer to be processed in a machining chamber in the heat-treatment simulation system of FIG. 14.

FIG. 17 is a diagram illustrating a modification example of the schematic configuration of the machining control system of FIG. 14.

MODES FOR CARRYING OUT THE INVENTION

Hereinafter, embodiments of the present disclosure will be described in detail with reference to the accompanying drawings. Note that the description is made in the following order:

1. First Embodiment (Simulator) . . . FIGS. 1 to 3

Example involving predicting change in crystal defect density

2. Modification Example of First Embodiment (Simulation Software) . . . FIGS. 4 and 5

3. Second Embodiment (Simulator) . . . FIGS. 6 to 8

Example involving predicting crystal defect density and change in crystal defect density 4. Modification Example of Second Embodiment (Simulation Software) . . . FIGS. 9 and 10

5. Third Embodiment (Heat Treatment Control System) . . . FIGS. 11 and 12

Example involving controlling heat treatment chamber based on predicted change in crystal defect density 6. Modification Example of Third Embodiment (Heat Treatment Control System) FIG. 13

7. Fourth Embodiment (Machining Control System) . . . FIGS. 14 to 16

Example involving controlling machining chamber based on predicted change in crystal defect density 8. Modification Example of Fourth Embodiment (Machining Control System) . . . FIG. 17

1. First Embodiment

Configuration

A simulator 10 according to a first embodiment of the present disclosure will now be described. FIG. 1 illustrates an exemplary schematic configuration of the simulator 10 according to the present embodiment. The simulator 10 includes an input unit 11, a calculation unit 12, and an output unit 13.

The input unit 11 acquires initial conditions for a semiconductor layer to be heat-treated (e.g., a semiconductor layer 15 of FIG. 2) and outputs them to the calculation unit 12. Here, the initial conditions include, for example, calculation conditions for simulation, the pattern structure of the semiconductor layer to be heat-treated, and the defect density distribution (initial defect density distribution) in the semiconductor layer to be heat-treated. Examples of the calculation conditions include the processing time of the semiconductor layer to be heat-treated, the processing temperature of the semiconductor layer to be heat-treated, calculation time steps, the values of the respective coefficients in recovery factors described below, and the activation energy of the respective defects included in the semiconductor layer to be heat-treated. The pattern structure is a structure formed on the semiconductor layer by semiconductor processing such as plasma etching or chemical vapor deposition (CVD). The initial defect density distribution is a defect density distribution generated in the semiconductor layer as a result of semiconductor processing such as plasma etching or CVD. The initial defect density distribution may be a distribution obtained by semiconductor process simulation or may be a distribution obtained by actual measurement.

The calculation unit 12 includes a defect-density change calculation unit 12A. The defect-density change calculation unit 12A calculates a temporal change in the defect density distribution in the semiconductor layer to be heat-treated by a simulation method described below on the basis of the initial conditions received via the input unit 11.

The output unit 13 outputs predetermined simulation results calculated by the calculation unit 12. The output unit 13 may also output, for example, the calculation conditions used in the simulation and the pattern structure of the semiconductor layer to be heat-treated together with the simulation results. The output unit 13 is configured by, for example, any of a display device displaying the simulation results, a printing device outputting the simulation results in a printed form, a recording device recording the simulation results, and the like, or an appropriate combination thereof.

In the present embodiment, the output unit 13 may be provided as an external device of the simulator 10. Further, in the present embodiment, the simulator 10 may further include a storing unit that stores the initial conditions and the simulation results received via the input unit 11.

Detailed Description of Simulation Method

Hereinafter, a simulation method to be executed by the defect-density change calculation unit 12A (hereinafter, simply referred to as "the present simulation method") is described.

FIG. 2 illustrates an exemplary calculation model in the simulator 10. FIG. 2 exemplifies a voxel model as the calculation model in the simulator 10. In the voxel model, the semiconductor layer to be heat-treated is partitioned into a plurality of voxels 17, and a change in the defect density is calculated per voxel 17. FIG. 2 exemplifies the semiconductor layer 15 to be heat-treated and a processed surface 16 of the semiconductor layer 15 fabricated by semiconductor processing such as plasma etching or CVD. The semiconductor layer 15 is an Si base, for example. Alternatively, a model other than the voxel model may be applied to the defect-density change calculation unit 12A.

In the simulation method, the defect density distribution in the semiconductor layer 15 includes three defect density distributions (an amorphous distribution D1, a dangling bond distribution D2 and a point defect distribution D3), as illustrated in FIG. 2. The amorphous distribution D1 is represented by the value of the amorphous density in each voxel 17 in the semiconductor layer 15. The dangling bond distribution D2 is represented by the value of the dangling bond density in each voxel 17 in the semiconductor layer 15. The point defect distribution D3 is represented by the value of the point defect density in each voxel 17 in the semiconductor layer 15.

The defect-density change calculation unit 12A calculates the amorphous distribution D1 in the semiconductor layer 15 on the basis of a recovery factor $Y_a$. The defect-density change calculation unit 12A further calculates the dangling bond distribution D2 in the semiconductor layer 15 on the basis of a recovery factor $Y_d$. The defect-density change calculation unit 12A further calculates the point defect distribution D3 in the semiconductor layer 15 on the basis of a recovery factor $Y_L$ in each calculation time step received via the input unit 11.

To obtain the amorphous distribution D1, the defect-density change calculation unit 12A calculates the defect density after the change (after the heat treatment) using the following equations (1) and (2):

$$Na' = Na \times Y_a \quad (1)$$

$$Y_a = a_a T\alpha^1 \times \exp(-E_a/(k_B T)) + b_a \quad (2),$$

where
Na' denotes the density after the change,
Na denotes the density before the change,
$Y_a$ denotes the recovery factor of the amorphous distribution D1,
$a_a$ denotes a coefficient,
T denotes the processing temperature of the semiconductor layer 15,
$\alpha 1$ denotes a coefficient,
$E_a$ denotes the activation energy of the amorphous distribution D1 (a constant value),
$k_B$ denotes a Boltzmann constant, and
$b_a$ denotes the proportion incompletely crystallized eventually.

To obtain the dangling bond distribution D2, the defect-density change calculation unit 12A calculates the defect density after the change (after the heat treatment) using the following equations (3) and (4):

$$Nd' = Nd \times Ya \quad (3)$$

$$Y_d = a_d T\alpha^2 \times \exp(-E_d/(k_B T)) + b_d \quad (4), \text{ where}$$

Nd' denotes the density after the change,
Nd denotes the density before the change,
$Y_d$ denotes the recovery factor of the dangling bond distribution D2,
$a_a$ denotes a coefficient,
T denotes the processing temperature of the semiconductor layer 15,
$\alpha_2$ denotes a coefficient,
$E_d$ denotes the activation energy of the dangling bond distribution D2 (a constant value),
$K_B$ denotes a Boltzmann constant, and
$b_d$ denotes the proportion incompletely crystallized eventually.

To obtain the point defect distribution D3, the defect-density change calculation unit 12A calculates the defect density in each calculation time step during the heat treatment using the following equations (5), (6), and (7):

$$N'(t_n) = N(t_{n-1}) \times Y_L(t) \quad (5)$$

$$Y_L(t_n) = a_L T\alpha^3 \times \exp(-E_L/(k_B T)) + b_L \quad (6)$$

$$E_L(N) = f(N(t_{n-1})) \quad (7),$$

where
$N'(t_n)$ denotes the density after the change,
$N(t_{n-1})$ denotes the density before the change,
$Y_L(t)$ and $Y_L(t_n)$ denote the recovery factors of the point defect distribution D3,
$a_L$ denotes a coefficient,
T denotes the processing temperature of the semiconductor layer 15,
$\alpha 3$ denotes a coefficient, $E_L$ and $E_L(N)$ denote the activation energy of the point defect distribution D3, $k_B$ denotes a Boltzmann constant, $b_L$ denotes the proportion incompletely crystallized eventually, and $f(N(t_{n-1}))$ denotes a polynomial.

The measurement of electrical properties (C-V) conducted by the applicant demonstrates that defects generated by semiconductor processing will not be completely recovered even by heat treatment. Thus, in the present simulation method, a parameter b is introduced as a representation of the unrecovered effect. Further, in the present simulation method, the change in the crystal defect generated by heating is calculated. The change in the crystal defect was formulated into the Arrhenius equation. Further, an analysis using small-scale molecular dynamics (MD) calculation demonstrated that the defects generated by heating would recover at an early stage in terms of the amorphous distribution D1 and the dangling bond distribution D2. Accordingly, the time-dependency of the amorphous distribution D1 and the dangling bond distribution D2 are ignored in the present simulation method.

The results of the measurements performed by the applicant so far demonstrate that the activation energy of the point defect distribution D3 depends on the point defect density. Accordingly, in the present simulation method, the activation energy of the point defect distribution D3 is represented by a polynomial having dependency on the point defect density. Further, it is desirable that $E_L$ and $E_L(N)$ be larger than $E_a$ and $E_b$ because the point defect is unlikely to be recovered by heat treatment compared with the amorphous and the dangling bond.

The defect-density change calculation unit 12A calculates the temporal changes in the three defect density distributions (the amorphous distribution D1, the dangling bond distribution D2, and the point defect distribution D3) for each voxel 17 before proceeding to the next calculation time step. The defect-density change calculation unit 12A repeats the calculation and ends the calculation when it reaches the processing time received via the input unit 11.

Calculation of Change in Defect Density

Described next is an exemplary procedure performed by in the defect-density change calculation unit 12A to predict a change in the crystal defect density. FIG. 3 illustrates an exemplary procedure performed by the defect-density change calculation unit 12A to predict a change in the crystal defect density.

First, the input unit 11 acquires the initial conditions for the semiconductor layer 15 to be heat-treated (Step S101). The initial conditions include, for example, calculation conditions for simulation, the pattern structure of the semiconductor layer 15 to be heat-treated, and the initial values of the three defect density distributions (the amorphous distribution D1, the dangling bond distribution D2, and the point defect distribution D3) (initial defect density distributions) in the semiconductor layer 15 to be heat-treated. Thereafter, the input unit 11 outputs the acquired initial conditions to the calculation unit 12 (the defect-density change calculation unit 12A).

The defect-density change calculation unit 12A calculates a temporal change of the defect density distribution on the basis of an arithmetic function using at least the activation energy of the defect included in the semiconductor layer 15, the processing temperature of the semiconductor layer 15, and the processing time of the semiconductor layer 15 as arguments. Specifically, the defect-density change calculation unit 12A calculates the temporal changes of the three defect density distributions (the amorphous distribution D1, the dangling bond distribution D2, and the point defect distribution D3) on the basis of the initial conditions received via the input unit 11 and three recovery factors ($Y_a$, $Y_d$, $Y_L(t)$) using the initial conditions received via the input unit 11 as an argument (Step S102).

The defect-density change calculation unit 12A calculates the temporal changes of the amorphous distribution D1 and the dangling bond distribution D2 using the activation energy of the amorphous distribution D1 and the activation energy of the dangling bond distribution D2 as constant arguments. The defect-density change calculation unit 12A calculates the temporal change of the point defect distribution D3 using the activation energy of the point defect distribution D3 as an argument dependent on the point defect density in the semiconductor layer 15. More specifically, the defect-density change calculation unit 12A calculates the temporal change of the point defect distribution D3 using the activation energy of the point defect distribution D3 as an argument in the polynomial of the point defect density in the semiconductor layer 15.

The defect-density change calculation unit 12A calculates the temporal changes of the three defect density distributions (the amorphous distribution D1, the dangling bond distribution D2, and the point defect distribution D3) for every voxel 17 (Step S103). When completing the calculation for every voxel 17, the defect-density change calculation unit 12A conducts time evolution ($t_n$ to $t_{n+1}$) (Step S105) and calculates the temporal change (Step S104) only of the point defect distribution D3 until it reaches the processing time received via the input unit 11. When it reaches the processing time received via the input unit 11, the defect-density change calculation unit 12A ends the calculation. In this case, the defect density distribution determined through the calculation performed by the defect-density change calculation unit 12A is expressed by, for example, the value of the defect density of each voxel 17. Note that the defect density of the voxel 17 is graphically illustrated at the lower right of FIG. 2.

Effects

Described next are effects of the simulator 10 according to the present embodiment.

Semiconductor Complementary Metal-Oxide-Semiconductor (CMOS) devices are fabricated by so-called semiconductor processing, such as plasma etching, CVD, or Physical Vapor Deposition (PVD), that processes a thin film into a fine pattern. The semiconductor processing is characterized by processing a film using physical and chemical reactions of the film surface caused by irradiating a base with the ions and radicals generated while plasma is generated. However, it has been known that the crystal structure of the film is broken by ion bombardment upon the irradiation, forming crystal defects (dangling bonds, point defects, or clusters). In CMOS devices, these crystal defects greatly affect the noise properties of transistors and sensor pixels. Thus, a reduction in crystal defects is of great importance. Further, the importance of knowing and reducing the amount and the distribution of crystal defects is becoming greater as CMOS devices become finer and more complex in the future.

In the semiconductor processing, a step of applying heat, such as annealing treatment, is performed to reduce crystal defects. Thus, knowing the crystal defect distribution after the heat treatment is particularly important because the crystal defect distribution is directly related to device characteristics. However, it is often difficult to measure and analyze a detailed distribution of crystal defects, particularly low-density defects, in actual processes and actual devices in terms of sensitivity, etc. Thus, one effective measure is to predict the crystal defect distribution by simulation, such as an MD calculation. In this method, the motion of each atom may be calculated on the basis of the potential between the atoms. This enables a detailed analysis of the temporal change of the crystal structure from heat application to heat relaxation.

However, in the MD calculation, the motion of each atom is calculated in a very short time step on the order of ps. This adds a lot of constraints to the calculation domain and the calculation time when directly compared with the semiconductor processing. Specifically, in a case where the crystal defect generated when a trench structure having a depth of 3 μm, a width of 200 nm, and a length 200 nm is etched has a density of of $10^{16}/cm^3$ order, for example, it takes an astronomically enormous amount of time, approximately $10^{11}$ hours, to calculate the recovery state of the defect 10 minutes after the annealing treatment. The MD calculation performed within realistic calculation time requires setting a small hypothetical area of several tens nm×several tens of nm×several tens of nm to represent the defect density, and limits the calculation of the annealing treatment to very short time on the order of μs. Thus, it is not realistic to predict the defect distribution after semiconductor heat treatment through such a conventional MD calculation.

In contrast, in the present embodiment, the temporal change of the defect density distribution is calculated on the basis of the arithmetic function using at least the activation energy of the defect included in the semiconductor layer 15 to be heat-treated, the processing temperature of the semiconductor layer 15 to be heat-treated, and the processing time of the semiconductor layer 15 to be heat-treated as arguments. This makes it possible to predict the crystal defect distribution in an actual pattern size within realistic calculation time. Further, because the crystal defect distribution is able to be calculated in the actual pattern size, it is possible to accurately predict the transistor characteristics and the pixel characteristics in view of the processing conditions and the variations of the conditions by using the crystal defect distribution obtained through the prediction as an input of the device simulation, for example.

Further, in the present embodiment, the temporal change of the point defect distribution D3 is calculated using the activation energy of the point defect distribution D3 as an argument dependent on the point defect density in the semiconductor layer 15 to be heat-treated. Thus, it is possible to accurately calculate the point defect distribution D3.

Further, in this embodiment, the temporal changes of the amorphous distribution D1 and the dangling bond distribution D2 are calculated using the activation energy of the amorphous distribution D1 and the activation energy of the dangling bond distribution D2 as constant arguments. This makes it possible to calculate the amorphous distribution D1 and the dangling bond distribution D2 in short time without compromising the accuracy.

Further, in the present embodiment, the temporal change of the point defect distribution D3 is calculated using the activation energy of the point defect distribution D3 as an argument in the polynomial of the point defect density in the semiconductor layer 15 to be heat-treated. This makes it possible to accurately calculate the point defect distribution D3.

Further, in the present embodiment, the temporal change of the point defect distribution D3 is calculated by applying the point defect density observed in a sequential time step to the polynomial of the point defect density in the semiconductor layer 15 to be heat-treated. This makes it possible to accurately calculate the point defect distribution D3.

2. Modification Example of First Embodiment

In the above-described embodiment, the defect-density change calculation unit 12A may calculate at least only the temporal change of the point defect distribution D3 among the three defect density distributions (the amorphous distribution D1, the dangling bond distribution D2, and the point defect distribution D3). In that case, it is possible to accurately calculate the point defect distribution D3.

Further, in the above-described embodiment, the defect-density change calculation unit 12A may be configured by hardware or a predetermined simulation program (software). In a case where the defect-density change calculation unit 12A is configured by a predetermined simulation program (software), it is possible to calculate the temporal change of the defect density distribution in the semiconductor layer 15 to be heat-treated by loading the simulation program (software) to a calculation unit such as a central processing unit (CPU) and executing the simulation program (software). In a case where the defect-density change calculation unit 12A is configured by a predetermined simulation program (software), the simulator 10 may be provided with a storing unit 14 that stores a simulation program 14A (the three recovery factors $Y_a, Y_d, Y_L$), as illustrated in FIG. 4, for example. The simulation program 14A is a program including a procedure to be performed by the defect-density change calculation unit 12A. The simulation program 14A corresponds to one specific example of a "defect-density calculation program" of the present disclosure. The simulator 10 according to the present modification example corresponds to one specific example of a "defect-density calculation apparatus" of the present disclosure.

Note that, as illustrated in FIG. 5, it is possible to apply the simulation method performed by the simulator 10 to simulation software 20 (program). The simulation software 20 corresponds to one specific example of a "defect-density calculation program" of the present disclosure.

The simulation software 20 includes a graphical user interface (GUI) 21 with which a user inputs the above-described initial conditions, a calculation engine 22, and a GUI 23 visualizing the simulation results. The calculation engine 22 includes an input unit 221, a defect-density change calculation unit 222, and an output unit 223. The input unit 221 transmits the above-described initial conditions to the defect-density change calculation unit 222. The output unit 223 transmits an output of the defect-density change calculation unit 222 to the GUI 23.

The platform for executing the simulation software 20 may be, for example, any of Windows (registered trademark), Linux (registered trademark), Unix (registered trademark), and Mac (registered trademark). Additionally, the GUIs 21 and 23 may use any graphic language such as OpenGL, Motif, or tcl/tk. The calculation engine 22 may use any programming language such as C, C++, Fortran, or JAVA (registered trademark).

The GUI 21 transmits the calculation conditions, the pattern structure, the initial defect density distribution as the initial conditions to the input unit 221. The defect-density change calculation unit 222 performs the calculation performed by the defect-density change calculation unit 12A.

The output unit 223 outputs the defect density information obtained by the calculation engine 22 to the GUI 23. The defect density information acquired by the calculation engine 22 is visualized by the GUI 23. The visualization of the defect density information may be performed in real time during the calculation.

3. Second Embodiment

Described next is a simulator 30 according to a second embodiment of the present disclosure. FIG. 6 illustrates a schematic exemplary configuration of the simulator 30 according to the present embodiment. The simulator 30 includes an input unit 31, a calculation unit 32, and an output unit 33. The calculation unit 32 includes an etching-film forming calculation unit 32A, and the defect-density change calculation unit 12A.

The input unit 31 acquires initial conditions for a semiconductor layer to be processed (e.g., a semiconductor layer 18 in FIG. 7) (hereinafter, referred to as initial machining conditions) and initial conditions for a semiconductor layer to be heat-treated (e.g., a semiconductor layer 19 in FIG. 7) (hereinafter, referred to as initial heat-treatment conditions) and outputs them to the calculation unit 12. FIG. 7 illustrates the pattern structure of the semiconductor layer 18 observed before a sidewall for the transistor is formed. FIG. 7 illustrates the pattern structure of the semiconductor layer 19 observed after the sidewall is formed by performing plasma etching on the semiconductor layer 18 of FIG. 7.

Here, the initial machining conditions include, for example, calculation conditions for the machining simulation to be performed by the etching-film forming calculation unit 32A and the pattern structure of the semiconductor layer to be processed. Examples of the calculation conditions for the machining simulation include a resist mask thickness, an aperture shape, and etching conditions (the device type, the applied frequency, the gas species, the flow rate, the pressure, the source/bias power, the ion energy, the etching time, the wafer temperature, etc.). The pattern structure of the semiconductor layer to be processed corresponds to the structure of a semiconductor layer to be subjected to semiconductor processing such as plasma etching or CVD.

The initial heat-treatment conditions include, for example, calculation conditions for the heat-treatment simulation to be performed by the defect-density change calculation unit 12A. Examples of the calculation conditions for the heat-treatment simulation include the processing time of the semiconductor layer to be heat-treated, the processing temperature of the semiconductor layer to be heat-treated, the calculation time step, the value of each coefficient in each recovery factor described below, and the activation energy of each defect included in the semiconductor layer to be heat-treated. Note that the pattern structure and the initial defect density distribution of the semiconductor layer to be heat-treated that are required in the heat-treatment simulation is calculated by the etching-film forming calculation unit 32A described later.

The calculation unit 32 includes the etching-film forming calculation unit 32A and the defect-density change calculation unit 12A, as described above. The etching-film forming calculation unit 32A calculates the pattern structure of the semiconductor layer 19 after being processed and the defect density distribution in the semiconductor layer 19 after being processed by a machining simulation method described below, on the basis of the initial machining conditions received via the input unit 31. The etching-film forming calculation unit 32A transmits the calculated pattern structure of the semiconductor layer 19 after being processed and the defect density distribution in the semiconductor layer 19 after being processed to the defect-density change calculation unit 12A. The defect-density change calculation unit 12A calculates the temporal change of the defect density distribution in the semiconductor layer 19 to be heat-treated by a heat-treatment simulation method on the basis of the initial heat-treatment conditions received via the input unit 31, the pattern structure of the semiconductor layer 19 after being processed received from the etching-film forming calculation unit 32A, and the defect density distribution in the pattern structure of the semiconductor layer 19 after being processed. That is, in the present embodiment, the defect-density change calculation unit 12A calculates the temporal change of the defect density distribution using the defect density distribution in the semiconductor layer 19 after being processed received from the etching-film forming calculation unit 32A as the initial defect density distribution.

The output unit 33 outputs the results of a predetermined simulation calculated by the calculation unit 32. The output unit 33 may output, for example, the calculation conditions used in the simulation and the pattern structure of the semiconductor layer to be processed or to be heat-treated together with the results of the simulation. The output unit 33 is configured by any appropriate combination of a display device displaying the results of the simulation, a printing device printing out and outputting the results of the simulation, a recording device recording the results of the simulation, or the like.

In the present embodiment, the output unit 33 may be provided as an external device of the simulator 30. Further, in the present embodiment, the simulator 30 may further include a storing unit storing the initial conditions and the simulation results received via the input unit 31.

Details of Simulation Method

Described below are the machining simulation method to be performed by the etching-film forming calculation unit 32A and the heat-treatment simulation method to be performed by the defect-density change calculation unit 12A.

FIG. 7 illustrates an exemplary calculation model in the simulator 30. The top portion of FIG. 7 illustrates the pattern structure of the semiconductor layer 18 observed before the sidewall of the transistor is formed and the pattern structure of the semiconductor layer 19 observed after the machining simulation methods is performed. To the machining simulation, a voxel model or a model other than the voxel model may be applied. The lower portion of FIG. 7 illustrates exemplary defect density distributions observed before and after the heat treatment. Note that the voxel model is exemplified in the lower portion of FIG. 7. In the voxel model, the pattern structure of the semiconductor layer 19 to be heat-treated is partitioned into a plurality of voxels, and the temporal change of the defect density is calculated per voxel. Alternatively, a model other than the voxel model may be applied to the defect-density change calculation unit 12A.

In the machining simulation method, sheath simulation (e.g., ER: HM5-07-0258, or Kushner, J. Appl. Phys 58, 4024 (2014)) is used to calculate the ion flux, for example. This makes it possible to calculate a more detailed incident angle and a more detailed energy distribution of the ion in view of the effects of collisions between the ions and other particles in the sheath.

The etching-film forming calculation unit 32A calculates the etching rate (the deposition rate in the case of plasma CVD), the shape, and the defect distribution by solving a surface reaction equation using the calculated values of ion flux and radical flux for each voxel, and causes the procedure to transit to the next calculation time step. The etching-film forming calculation unit 32A repeats the calculation. When it reaches the processing time received via the input unit 31, the etching-film forming calculation unit 32A ends the calculation.

Etching-Film Forming Calculation

Described next are the pattern structure of the semiconductor layer 19 obtained by the simulation performed by the etching-film forming calculation unit 32A, a procedure for predicting the crystal defect density in the semiconductor layer 19 (hereinafter, referred to as "first procedure"), and a procedure performed by the defect-density change calculation unit 12A to predict a change of the crystal defect density (hereinafter, referred to as "second procedure"). FIG. 8 illustrates an example of the first and second procedures.

First, the input unit 31 acquires the initial conditions for the semiconductor layer 18 to be processed (Step S201). The initial conditions include, for example, the initial machining conditions described above and the initial heat treatment conditions described above. Next, the input unit 31 transmits the acquired initial conditions to the calculation unit 32 (the etching-film forming calculation unit 32A and the defect-density change calculation unit 12A).

The etching-film forming calculation unit 32A calculates the ion flux and the radical flux incident on any evaluation point using the received initial machining conditions (Step S202 and S203). Thereafter, the etching-film forming calculation unit 32A calculates the etching rate, the shape, and the defect distribution for each voxel by solving the surface reaction equation using the ion flux and the radical flux obtained by the calculation. The etching-film forming calculation unit 32A causes the procedure to transit to the next calculation time step (Steps S204, S205, S206, and S207). The etching-film forming calculation unit 32A repeats the calculation. When it reaches the processing time received via the input unit 31, the etching-film forming calculation unit 32A ends the calculation (Step S208).

The etching-film forming calculation unit 32A transmits the calculated structure after being processed and the defect density distribution in the structure after being processed to the defect-density change calculation unit 12A. The defect-density change calculation unit 12A calculates the temporal change of the defect density distribution in the semiconductor layer 19 to be heat-treated by the simulation method described above on the basis of the initial heat-treatment conditions received via the input unit 11, the structure after being processed received from the etching-film forming calculation unit 32A, and the defect density distribution in the structure after being processed (Steps S101 to S105). When it reaches the processing time received via the input unit 31, the defect-density change calculation unit 12A ends the calculation.

Effects

Described next are the effects of the simulator 30 according to the present embodiment.

In the present embodiment, the pattern structure of the semiconductor layer 19 after being processed and the defect density distribution in the structure after being processed, which are obtained by the etching-film forming calculation unit 32A, are used as the initial conditions transmitted to the defect-density change calculation unit 12A. This makes it possible to predict the crystal defect distribution more actually conforming to the process.

4. Modification Example of Second Embodiment

In the second embodiment described above, the defect-density change calculation unit 12A and the etching-film forming calculation unit 32A may be configured by hardware or predetermined simulation programs (software). In a case where the defect-density change calculation unit 12A and the etching-film forming calculation unit 32A are configured by predetermined simulation programs (software), it is possible to calculate the pattern structure of the semiconductor layer 19 after being processed, the defect density distribution in the semiconductor layer 19 after being processed, and the temporal change of the defect density distribution in the semiconductor layer 19 after being processed by loading the simulation programs (software) to a calculation unit such as a central processing unit (CPU) and executing the simulation programs (software). In a case where the defect-density change calculation unit 12A and the etching-film forming calculation unit 32A are configured by predetermined simulation programs (software), the simulator 10 may be provided with a storing unit 34 that stores a simulation program 34A (the three recovery factors $Y_a$, $Y_d$, $Y_L$), as illustrated in FIG. 9, for example. The simulation program 34A is a program including a procedure to be performed by the defect-density change calculation unit 12A and the etching-film forming calculation unit 32A. The simulation program 34A corresponds to one specific example of the "defect-density calculation program" of the present disclosure. The simulator 30 according to the present modification example corresponds to one specific example of the "defect-density calculation apparatus" of the present disclosure.

Note that, as illustrated in FIG. 10, the simulation method performed by the simulator 30 may be applied to the simulation software 40 (program). The simulation software 40 corresponds to one specific embodiment of the "defect-density calculation program" of the present disclosure.

The simulation software 40 includes a graphical user interface (GUI) 41 with which the user inputs the above-described initial conditions, a calculation engine 42, and a GUI 43 visualizing the simulation results. The calculation engine 42 includes an input unit 421, an etching-film forming calculation unit 422, a defect-density change calculation unit 423, and an output unit 424. The input unit 421 transmits the above-described initial conditions to the defect-density change calculation unit 423. The output unit 424 transmits an output of the defect-density change calculation unit 423 to the GUI 43.

The platform for executing the simulation software 40 may be, for example, any of Windows (registered trademark), Linux (registered trademark), Unix (registered trademark), and Mac (registered trademark). Additionally, the GUIs 41 and 43 may use any graphic language such as OpenGL, Motif, or tcl/tk. The calculation engine 22 may use any programming language such as C, C++, Fortran, or JAY A.

The GUI 41 transmits the initial machining conditions described above and the initial heat-treatment conditions described above as the initial conditions to the input unit 421. The etching-film forming calculation unit 422 performs the calculation performed by the etching-film forming calculation unit 32A. The defect-density change calculation unit 423 performs the calculation performed by the defect-density change calculation unit 12A. The output unit 424 outputs the defect density information obtained by the calculation engine 42 to the GUI 43. The defect density information acquired by the calculation engine 42 is visualized by the GUI 43. The visualization of the defect density information may be performed in real time during the calculation.

5. Third Embodiment

Configuration

Described next is a heat treatment control system 50 according to a third embodiment of the present disclosure. FIG. 11 illustrates an exemplary schematic configuration of the heat treatment control system 50 according to the present embodiment. The heat treatment control system 50 according to the present embodiment corresponds to one specific example of a "heat treatment control system" of the present disclosure. The heat treatment control system 50 includes a heat treatment chamber 51, a heat-treatment simulation system 52, a fault detection and classification/equipment engineering system (FDC/EES system) 53, and a control system 54.

The heat treatment chamber 51 is, for example, an annealing apparatus that reduces defects in a semiconductor layer by heat treatment. The heat treatment chamber 51 includes, for example, a recipe 511 serving as heat treatment conditions in the annealing apparatus. The recipe 511 includes heating condition data such as processing time and processing temperature. The heating condition data of the recipe 511 is set by a control signal outputted from the control system 54. The heat treatment chamber 51 writes the heating condition data (e.g., data such as the processing time and the processing temperature) in the recipe 511 on the basis of the control signal received from the control system 54.

The heat-treatment simulation system 52 is a simulator that simulates the heat treatment on a semiconductor layer in the heat treatment chamber 51. The heat-treatment simulation system 52 includes, for example, an initial condition input unit 521 and an optimization calculation unit 522.

The initial condition input unit 521 acquires the heating condition data (e.g., data such as the processing time and the processing temperature) of the recipe 511 from the heat treatment chamber 51, and transmits the data to the optimization calculation unit 522. The optimization calculation unit 522 includes the defect-density change calculation unit 12A and a correction process condition output unit 523. The defect-density change calculation unit 12A calculates the temporal change of the defect density distribution in the semiconductor layer to be heat-treated on the basis of the heating condition data received via the initial condition input unit 521 and information Data1 received from the outside. The heating condition data received via the initial condition input unit 521 includes, for example, the processing time and the processing temperature. The information Data1 received from the outside includes, for example, the pattern structure of the semiconductor layer to be heat-treated, the defect density distribution in the semiconductor layer to be heat-treated (the initial defect density distribution), the defect density required in the semiconductor layer after the heat treatment (a required defect density).

The defect-density change calculation unit 12A outputs the results of the simulation (the defect density distribution) obtained by the calculation to the correction process condition output unit 523. The correction process condition output unit 523 compares the defect density distribution obtained by the calculation with the required defect density received from the outside, and ends the calculation in a case where the results of the comparison are within a predetermined range. In a case where the results of the comparison deviate from the predetermined range, the correction process condition output unit 523 calculates the processing time and the processing temperature in the heat treatment chamber 51 as correction data 523A on the basis of the results. The correction process condition output unit 523 transmits the calculated correction data 523A to the control system 54. That is, the heat treatment control system 50 serves as a system that optimizes the heating conditions for the semiconductor layer to be heat-treated in the heat treatment chamber 51.

In a case where the results of the comparison deviate too far from the predetermined range to correct the processing time and the processing temperature in the heat treatment chamber 51, the correction process condition output unit 523 outputs a signal indicating the abnormality to the FDC/EES system 53. The FDC/EES system 53 notifies the abnormality of the heat treatment on the basis of the signal received from the heat-treatment simulation system 52 (the correction process condition output unit 523).

When receiving the correction data 523A from the heat-treatment simulation system 52 (the correction process condition output unit 523), the control system 54 generates a control signal based on the input correction data 523A. The control system 54 transmits the generated control signal to the heat treatment chamber 51.

Optimization of Heating Conditions

Described next is a procedure for optimizing the heating conditions for the semiconductor layer to be heated in heat treatment control system 50. FIG. 12 illustrates an example of the procedure for optimizing the heating conditions for the semiconductor layer to be heated in the heat treatment chamber 51 in the heat treatment control system 50.

First, the initial condition input unit 521 acquires the heating condition data (e.g., data such as the processing time and the processing temperature) of the recipe 511 from the heat treatment chamber 51 (Step S101). The initial condition input unit 521 further acquires information Data1 from the outside (Step S101). The initial condition input unit 521 transmits the acquired heating condition data and the acquired information Data1 to the optimization calculation unit 522 (the defect-density change calculation unit 12A).

The defect-density change calculation unit 12A calculates the temporal change of the defect density distribution in the semiconductor layer to be heat-treated on the basis of the heating condition data and the information Data1 received (Step S102). The defect-density change calculation unit 12A calculates the temporal change of the defect density distribution for every voxel (Step S103). When completing the calculation for every voxel 17, the defect-density change calculation unit 12A conducts time evolution ($t_n$ to $t_{n+1}$) (Step S105) and calculates the temporal change (Step S104) only of the point defect distribution D3 until it reaches the processing time received via the input unit 11. When it reaches the processing time received via the input unit 11, the defect-density change calculation unit 12A ends the calculation. In that case, the defect density distribution obtained through the calculation performed by the defect-density change calculation unit 12A is represented by, for example, the value of the defect density of each voxel.

The defect-density change calculation unit 12A outputs the results of the simulation (the defect density distribution) obtained by the calculation to the correction process condition output unit 523. The correction process condition output unit 523 determines whether the calculated defect density distribution has reached a desired defect distribution (Step S106). Specifically, the correction process condition output unit 523 compares the defect density distribution obtained by the calculation with the required defect density received from the outside. The correction process condition output unit 523 ends the calculation in a case where the results of the comparison are within the predetermined range.

In a case where the results of the comparison deviate from the predetermined range (if the results of the comparison do not satisfy a desired condition), the correction process condition output unit 523 calculates the processing time and the processing temperature in the heat treatment chamber 51 as the correction data 523A on the basis of the results. The correction process condition output unit 523 transmits the calculated correction data 523A to the control system 54. When receiving the correction data 523A from the heat-treatment simulation system 52 (the correction process condition output unit 523), the control system 54 generates a control signal based on the received correction data 523A. The control system 54 transmits the generated control signal to the heat treatment chamber 51. The heat treatment chamber 51 writes the heating condition data (e.g., data such as the processing time and the processing temperature) in the recipe 511 on the basis of the control signal received from the control system 54 to correct the recipe 511 (e.g., the processing temperature and the processing time) (Step S107). In this way, the heating conditions for the semiconductor layer to be heated in the heat treatment control system 50 are optimized.

Effects

Described next are effects of the heat treatment control system 50 according to the present embodiment.

In the present embodiment, the temporal change of the defect density distribution in the semiconductor layer to be heat-treated is calculated on the basis of the heating condition data received from the heat treatment chamber 51 and the information Data1 received from the outside. Specifically, the temporal change of the defect density distribution is calculated on the basis of an arithmetic function using at least the activation energy of the defect included in the semiconductor layer to be heat-treated, the processing temperature of the semiconductor layer to be heat-treated, and the processing time of the semiconductor layer to be heat-treated as arguments. This makes it possible to predict the crystal defect distribution in an actual pattern size within realistic calculation time. Further, because the crystal defect distribution is able to be calculated in the actual pattern size, it is possible to optimize the heat treatment conditions on the basis of the crystal defect distribution obtained by the prediction and the required defect density. As a result, it is possible to accurately predict the transistor characteristics and the pixel characteristics.

6. Modification Example of Third Embodiment

In the third embodiment, the defect-density change calculation unit 12A may be configured by hardware or predetermined simulation programs (software). In a case where the defect-density change calculation unit 12A is configured by predetermined simulation programs (software), it is possible to calculate the temporal change of the defect density distribution in the semiconductor layer to be heated by loading the simulation programs (software) to a calculation unit such as a central processing unit (CPU) and executing the simulation programs (software). In a case where the defect-density change calculation unit 12A is configured by predetermined simulation programs (software), the heat-treatment simulation system 52 may be provided with a storing unit 524 that stores the simulation program 14A (software), as illustrated in FIG. 13, for example. The simulation program 14A is a program including the procedure to be performed by the defect-density change calculation unit 12A.

7. Fourth Embodiment

Configuration

Described next is a machining control system 60 according to a fourth embodiment of the present disclosure. FIG. 14 illustrates a schematic configuration of the machining control system 60 according to the present embodiment. The machining control system 60 according to the present embodiment corresponds to one specific example of a "machining control system" of the present disclosure. The machining control system 60 includes a machining chamber 61, a machining simulation system 62, a heat-treatment simulation system 52, an FDC/EES system 63, and a control system 64.

The machining chamber 61 is, for example, a processing apparatus that forms a desired pattern structure on a semiconductor layer by processing such as plasma etching or CVD. The machining chamber 61 includes, for example, a recipe 611 serving as machining conditions in the machining apparatus, and monitoring data 612 obtained by a monitoring apparatus that monitors the state (e.g., the state of the plasma) in the machining chamber 61. The recipe 611 includes machining condition data such as the device type, the applied frequency, the gas species, the flow rate, the pressure, the source/bias power, the ion energy, the etching time, and the wafer temperature. The machining condition data of the recipe 611 is set by a control signal outputted from the control system 64. The machining chamber 61 writes the machining condition data (e.g., data such as the device type, the applied frequency, the gas species, the flow rate, the pressure, the source bias power, the ion energy, the etching time, and the wafer temperature) of the recipe 611 on the basis of the control signal received from the control system 64.

The machining simulation system 62 is a simulator that simulates the machining processing on a semiconductor layer in the machining chamber 61. The machining simulation system 62 includes a recipe adjustment calculation unit 621, a gas density-energy calculation unit 622, an aperture ratio calculation unit 623, an optimization calculation unit 624, and a result output unit 627, as illustrated in FIG. 15, for example.

The recipe adjustment calculation unit 621 generates the machining conditions in the machining chamber 61 (i.e., the machining conditions to be written in the recipe 611) on the basis of the correction data 523A received from the heat-treatment simulation system 52. The gas density-energy calculation unit 622 calculates the gas density and the gas energy in the machining chamber 61 on the basis of the machining conditions generated by the recipe adjustment calculation unit 621 and the monitoring data 612 obtained from the machining chamber 61. The aperture ratio calculation unit 623 calculates the aperture ratio of the mask formed on the semiconductor layer to be processed on the basis of Graphic Design System (GDS)/film thickness information Data2 received from the outside.

The optimization calculation unit 624 has a shape calculation unit 625 and a defect density calculation unit 626. The shape calculation unit 625 calculates the flux and the etching rate (the deposition rate in the case of plasma CVD) on the basis of the gas density and the gas energy in the machining chamber 61 obtained by the gas density-energy calculation unit 622 and the aperture ratio obtained by the aperture ratio calculation unit 623, and whereby calculates the shape of the semiconductor layer after being processed (the pattern structure). The defect density calculation unit 626 calculates the defect density distribution after the processing on the basis of the flux and the etching rate obtained by the optimization calculation unit 624 (the deposition rate in the case of plasma CVD). The optimization calculation unit 624 outputs the pattern structure of the semiconductor layer after being processed, which is obtained by the shape calculation unit 625, and the defect density distribution of the semiconductor layer after being processed, which is obtained by the defect-density calculation unit 626, to the result output unit 627. The result output unit 627 transmits the pattern structure and the defect density distribution of the semiconductor layer after being processed to the heat-treatment simulation system 52.

The heat-treatment simulation system 52 (the optimization calculation unit 522) acquires the heating condition data (e.g., data such as the processing time and the processing temperature) and the defect density required in the semiconductor layer after the heat treatment (the required defect density) via the initial condition input unit 521. The heat-treatment simulation system 52 (the optimization calculation unit 522) further acquires, for example, the pattern structure and the defect density distribution of the semiconductor layer after being processed from the machining simulation system 62. The defect-density change calculation unit 12A in the optimization calculation unit 522 calculates the temporal change of the defect density distribution in the semiconductor layer to be heat-treated on the basis of the heating condition data, and the pattern structure and the defect density distribution of the semiconductor layer after being processed.

The defect-density change calculation unit 12A outputs the results of the simulation (the defect density distribution) obtained by the calculation to the correction process condition output unit 523. The correction process condition output unit 523 compares the defect density distribution obtained by the calculation with the required defect density received from the outside, and ends the calculation in a case where the results of the comparison are within a predetermined range. In a case where the results of the comparison deviate from the predetermined range, the correction process condition output unit 523 calculates the machining conditions in the machining chamber 61 as the correction data 523A on the basis of the results, The correction process condition output unit 523 transmits the calculated correction data 523A to the control system 64. That is, the machining control system 60 serves as a system that optimizes the machining conditions for the semiconductor layer to be processed in the machining chamber 61.

In a case where the results of the comparison deviate too far from the predetermined range to correct the machining conditions in the machining chamber 61, the correction process condition output unit 523 outputs a signal indicating the abnormality to the FDC/EES system 63, The FDC/EES system 63 notifies the abnormality of the machining processing on the basis of the signal received from the heat-treatment simulation system 52 (the correction process condition output unit 523).

When receiving the correction data 523A from the heat-treatment simulation system 52 (the correction process condition output unit 523), the control system 64 generates a control signal based on the input correction data 523A. The control system 64 transmits the generated control signal to the machining chamber 61.

Optimization of Machining Conditions

Described next is a procedure for optimizing the machining conditions for the semiconductor layer to be processed in the machining control system 60. FIG. 16 illustrates an example of the procedure for optimizing the machining conditions for the semiconductor layer to be processed in the machining chamber 61 in the machining control system 60.

First, the heat-treatment simulation system 52 (the optimization calculation unit 522) acquires the heating condition data (e.g., data such as the processing time and the processing temperature) and the defect density required in the semiconductor layer after the heat treatment (the required defect density) via the initial condition input unit 521 (Step S101). The heat-treatment simulation system 52 (the optimization calculation unit 522) further acquires, for example, the pattern structure and the defect density distribution of the semiconductor layer after being processed from the machining simulation system 62 (Step S101).

Next, the defect-density change calculation unit 12A in the optimization calculation unit 522 calculates the temporal change of the defect density distribution in the semiconductor layer to be heat-treated on the basis of the heating condition data, the pattern structure and the defect density distribution of the semiconductor layer after being processed (Step S102). The defect-density change calculation unit 12A calculates the temporal change of the defect density distribution for every voxel (Step S103). When completing the calculation for every voxel 17, the defect-density change calculation unit 12A conducts time evolution ($t_n$ to $t_{n+1}$) (Step S105) and calculates the temporal change (Step S104) only of the point defect distribution D3 until it reaches the processing time received via the input unit 11. When it reaches the processing time received via the input unit 11, the defect-density change calculation unit 12A ends the calculation. In that case, the defect density distribution obtained through the calculation performed by the defect-density change calculation unit 12A is represented by, for example, the value of the defect density of each voxel.

The defect-density change calculation unit 12A outputs the results of the simulation (the defect density distribution) obtained by the calculation to the correction process condition output unit 523. The correction process condition output unit 523 determines whether the calculated defect density distribution has reached a desired defect distribution (Step S106). Specifically, the correction process condition output unit 523 compares the defect density distribution obtained by the calculation with the required defect density received from the outside. The correction process condition output unit 523 ends the calculation in a case where the results of the comparison are within the predetermined range.

In a case where the results of the comparison deviate from the predetermined range, the correction process condition output unit 523 calculates the machining conditions in the machining chamber 61 as the correction data 523A on the basis of the results. The correction process condition output unit 523 transmits the calculated correction data 523A to the control system 64. When receiving the correction data 523A from the heat-treatment simulation system 52 (the correction process condition output unit 523), the control system 64 generates a control signal based on the received correction data 523A. The control system 64 transmits the generated control signal to the machining chamber 61. The machining chamber 61 writes the machining condition data in the recipe 611 on the basis of the control signal received from the control system 64 to corrects the recipe 611 (Step S108). In this way, he machining conditions for the semiconductor layer to be processed in the machining control system 60 are optimized.

Effects

Described next are effects of the machining control system 60 according to the present embodiment.

In the present embodiment, the temporal change of the defect density distribution in the semiconductor layer to be heat-treated is calculated on the basis of the heating condition data received via the initial condition input unit 521 and the pattern structure and the defect density distribution of the semiconductor layer after being processed received from the machining simulation system 62. Specifically the temporal change of the defect density distribution is calculated on the basis of an arithmetic function using at least the activation energy of the defect included in the semiconductor layer to be heat-treated, the processing temperature of the semiconductor layer to be heat-treated, and the processing time of the semiconductor layer to be heat-treated as arguments. This makes it possible to predict the crystal defect distribution in an actual pattern size within realistic calculation time. Further, because the crystal defect distribution is able to be calculated in the actual pattern size, it is possible to optimize the heat treatment conditions on the basis of the crystal defect distribution obtained by the prediction and the required defect density. As a result, it is possible to accurately predict the transistor characteristics and the pixel characteristics.

8. Modification Example of Fourth Embodiment

In the fourth embodiment, the defect-density change calculation unit 12A may be configured by hardware or predetermined simulation programs (software). In a case where the defect-density change calculation unit 12A is configured by predetermined simulation programs (software), it is possible to calculate the temporal change of the defect density distribution in the semiconductor layer to be heated by loading the simulation programs (software) to a calculation unit such as central processing unit (CPU) and executing the simulation programs (software). In a case where the defect-density change calculation unit 12A is configured by predetermined simulation programs (software), the heat-treatment simulation system 52 may be provided with the storing unit 524 that stores the simulation program 14A (software), as illustrated in FIG. 17, for example. The simulation program 14A is a program including the procedure to be performed by the defect-density change calculation unit 12A.

It is also possible for the present disclosure to have the following configurations.

(1) A defect density calculation method of calculating a temporal change of the defect density distribution in a semiconductor layer, the method including calculating the temporal change of the defect density distribution on the basis of an arithmetic function using at least the activation energy of a defect included in the semiconductor layer, the processing temperature of the semiconductor layer, and the processing time of the semiconductor layer as arguments.

(2) The defect density calculation method according to (1), in which
the semiconductor layer includes a point defect distribution, and
the method includes calculating the temporal change of the defect density distribution using the activation energy of the point defect distribution as an argument dependent on a point defect density in the semiconductor layer.

(3) The defect density calculation method according to (2), in which
the semiconductor layer includes an amorphous distribution and a dangling bond distribution in addition to the point defect distribution, and
the method includes calculating the temporal change of the defect density distribution using the activation energy of the amorphous distribution and the activation energy of the dangling bond distribution as constant arguments.

(4) The defect density calculation method according to (2) or (3), including
calculating the temporal change of the defect density distribution using the activation energy of the point defect distribution as an argument of a polynomial of the point defect density in the semiconductor layer.

(5) The defect density calculation method according to (4), including
calculating the temporal change of the defect density distribution by assigning the point defect density in a sequential time step to the polynomial.

(6) The defect density calculation method according to any one of (1) to (5), further including
correcting the processing temperature and the processing time on the basis of the defect density distribution obtained by the calculating in a case where the defect density distribution obtained by the calculating does not satisfy a desired condition, and
setting the processing temperature and the processing time after the correcting as the arguments of the arithmetic function.

(7) A defect-density calculation program that calculates a temporal change of the defect density distribution in a semiconductor layer, the program causing a computer to calculate the temporal change of the defect density distribution on the basis of an arithmetic function using at least the activation energy of a defect included in the semiconductor layer, the processing temperature of the semiconductor layer, and the processing time of the semiconductor layer as arguments.

(8) A defect-density calculation apparatus that calculates a temporal change of the defect density distribution in a semiconductor layer, the apparatus including:
a storing unit that stores an arithmetic function using at least the activation energy of a defect included in the semiconductor layer, the processing temperature of the semiconductor layer, and the processing time of the semiconductor layer as arguments; and
a calculation unit that calculates the temporal change of the defect density distribution on the basis of an output value of the arithmetic function obtained by assigning the activation energy, the processing temperature, and the processing time to the arithmetic function read from the storing unit depending on an elapse of the processing time.

(9) A heat treatment control system including:
a heat treatment unit that conducts heat treatment on a semiconductor layer;
a control unit that controls the heat treatment unit; and
a defect density change calculation unit, in which
the defect density change calculation unit includes
a calculation unit that calculates a temporal change of the defect density distribution on the basis of an arithmetic function using at least the activation energy of a defect included in the semiconductor layer, processing temperature of the semiconductor layer, and processing time of the semiconductor layer as arguments,
a condition generating unit that generates a heat treatment condition for the heat treatment unit on the basis of the defect density distribution obtained by the calculation unit and a desired defect density distribution, and
the heat treatment unit conducts the heat treatment on the semiconductor layer on the basis of the heat treatment condition generated by the condition generating unit.

(10) A machining control system including:
a machining unit that processes a semiconductor layer;
a control unit that controls the machining unit;
a defect density calculation unit; and
a defect density change calculation unit, in which
the defect density calculation unit calculates a defect density distribution in the semiconductor layer generated when the machining unit processes the semiconductor layer, and outputs the defect density distribution obtained thereby to the defect density change calculation unit,
the defect density change calculation unit includes
a calculation unit that calculates a temporal change of the defect density distribution received from the defect density calculation unit on the basis of an arithmetic function using at least the activation energy of a defect included in the semiconductor layer, the processing temperature of the semiconductor layer, and the processing time of the semiconductor layer as arguments, and
a condition generating unit that generates a heat treatment condition for the heat treatment unit on the basis of the defect density distribution obtained by the calculation unit and a desired defect density distribution, and
the machining unit processes the semiconductor layer on the basis of the machining condition generated by the condition generating unit.

In the defect density calculation method, the defect-density calculation program, the defect-density calculation apparatus, the heat treatment control system, and the machining control system according to one embodiment of of the present disclosure, the temporal change of the defect density distribution is calculated on the basis of an arithmetic function using at least the activation energy of the defect included in the semiconductor layer, the processing temperature of the semiconductor layer, and the processing time of the semiconductor layer as arguments. This makes it possible to predict the crystal defect distribution in an actual pattern size within realistic calculation time. Further, because the crystal defect distribution is able to be calculated in the actual pattern size, it is possible to accurately predict the transistor characteristics and the pixel characteristics in view of the processing conditions and the variations of the conditions by using the crystal defect distribution obtained through the prediction as an input of the device simulation. Note that the effects of the present technology are not necessarily limited to the effects described here, and may be any of the effects described herein.

This application claims the priority of Japanese Patent Application No. 2019-087455 filed with the Japanese Patent Office on May 7, 2019, the entire contents of which are incorporated herein by reference.

Those skilled in the art could conceive of various modifications, combinations, sub-combinations, and changes in accordance with design requirements and other factors. However, it is understood that they are included within the scope of the appended claims or the equivalents thereof.

The invention claimed is:

1. A defect density determination method that determines a temporal change of a defect density distribution in a semiconductor layer and performs a heat treatment on the semiconductor layer, the method comprising:
calculating the temporal change of the defect density distribution on a basis of an arithmetic function using at least activation energy of a defect included in the semiconductor layer, processing temperature of the semiconductor layer, and processing time of the semiconductor layer as arguments, wherein the semiconductor layer includes a point defect distribution;
calculating the temporal change of the defect density distribution using activation energy of the point defect distribution as an argument dependent on a point defect density in the semiconductor layer; and
outputting results of calculating the temporal change of the defect density distribution to a graphical user interface;
generating a heat treatment condition on a basis of the defect density distribution and a desired defect density distribution; and
conducting the heat treatment on the semiconductor layer on a basis of the heat treatment condition.

2. The defect density determination method according to claim 1, wherein
the semiconductor layer includes an amorphous distribution and a dangling bond distribution in addition to the point defect distribution, and the method comprises calculating the temporal change of the defect density distribution using activation energy of the amorphous distribution and activation energy of the dangling bond distribution as constant arguments.

3. The defect density determination method according to claim 1, further comprising:
calculating the temporal change of the defect density distribution using the activation energy of the point defect distribution as an argument of a polynomial of the point defect density in the semiconductor layer.

4. The defect density determination method according to claim 3, further comprising:
calculating the temporal change of the defect density distribution by assigning the point defect density in a sequential time step to the polynomial.

5. The defect density determination method according to claim 1, further comprising:
correcting the processing temperature and the processing time on a basis of the defect density distribution obtained by the calculating in a case where the defect density distribution obtained by the calculating does not satisfy a desired condition, and setting the processing temperature and the processing time after the correcting as the arguments of the arithmetic function.

6. A non-transitory computer readable medium storing a defect-density determination program that determines a temporal change of a defect density distribution in a semiconductor layer and performs a heat treatment on the semiconductor layer, the program being executable by a processor to perform operations comprising:

calculating the temporal change of the defect density distribution on a basis of an arithmetic function using at least activation energy of a defect included in the semiconductor layer, processing temperature of the semiconductor layer, and processing time of the semiconductor layer as arguments, wherein the semiconductor layer includes a point defect distribution;

calculating the temporal change of the defect density distribution using activation energy of the point defect distribution as an argument dependent on a point defect density in the semiconductor layer;

outputting results of calculating the temporal change of the defect density distribution to a graphical user interface;

generating a heat treatment condition on a basis of the defect density distribution and a desired defect density distribution; and conducting the heat treatment on the semiconductor layer on a basis of the heat treatment condition.

7. A defect-density determination apparatus that determines a temporal change of a defect density distribution in a semiconductor layer and performs a heat treatment on the semiconductor layer, the apparatus comprising:

a memory that stores an arithmetic function using at least activation energy of a defect included in the semiconductor layer, processing temperature of the semiconductor layer, and processing time of the semiconductor layer as arguments; and a processor configured to calculate the temporal change of the defect density distribution on a basis of an output value of the arithmetic function obtained by assigning the activation energy, the processing temperature, and the processing time to the arithmetic function read from the memory depending on an elapse of the processing time, wherein the semiconductor layer includes a point defect distribution, calculate the temporal change of the defect density distribution using activation energy of the point defect distribution as an argument dependent on a point defect density in the semiconductor layer, output results of calculating the temporal change of the defect density distribution to a graphical user interface, generate a heat treatment condition on a basis of the defect density distribution and a desired defect density distribution, and conduct the heat treatment on the semiconductor layer on a basis of the heat treatment condition.

8. A heat treatment control system comprising:
a heat treatment unit that conducts heat treatment on a semiconductor layer;
a control unit that controls the heat treatment unit; and
a defect density change calculation unit, wherein
the defect density change calculation unit includes a calculation unit that calculates a temporal change of a defect density distribution on a basis of an arithmetic function using at least activation energy of a defect included in the semiconductor layer, processing temperature of the semiconductor layer, and processing time of the semiconductor layer as arguments, wherein the semiconductor layer includes a point defect distribution, and that calculates the temporal change of the defect density distribution using activation energy of the point defect distribution as an argument dependent on a point defect density in the semiconductor layer, and a condition generating unit that generates a heat treatment condition for the heat treatment unit on a basis of the defect density distribution obtained by the calculation unit and a desired defect density distribution, and wherein the heat treatment unit conducts the heat treatment on the semiconductor layer on a basis of the heat treatment condition generated by the condition generating unit.

9. A machining control system comprising:
a machining unit that processes a semiconductor layer;
a control unit that controls the machining unit;
a defect density calculation unit; and
a defect density change calculation unit, wherein the defect density calculation unit calculates a defect density distribution in the semiconductor layer generated when the machining unit processes the semiconductor layer, and outputs the defect density distribution obtained thereby to the defect density change calculation unit, the defect density change calculation unit includes a calculation unit that calculates a temporal change of the defect density distribution received from the defect density calculation unit on a basis of an arithmetic function using at least activation energy of a defect included in the semiconductor layer, processing temperature of the semiconductor layer, and processing time of the semiconductor layer as arguments, and a condition generating unit that generates a machining condition for the machining unit on a basis of the defect density distribution obtained by the calculation unit and a desired defect density distribution, and the machining unit processes the semiconductor layer on a basis of the machining condition generated by the condition generating unit.

10. The non-transitory computer readable medium according to claim 6, wherein the semiconductor layer includes an amorphous distribution and a dangling bond distribution in addition to the point defect distribution, and the operations further comprise calculating the temporal change of the defect density distribution using activation energy of the amorphous distribution and activation energy of the dangling bond distribution as constant arguments.

11. The non-transitory computer readable medium according to claim 6, wherein the operations further comprise:

calculating the temporal change of the defect density distribution using the activation energy of the point defect distribution as an argument of a polynomial of the point defect density in the semiconductor layer.

12. The non-transitory computer readable medium according to claim 11, wherein the operations further comprise:

calculating the temporal change of the defect density distribution by assigning the point defect density in a sequential time step to the polynomial.

13. The non-transitory computer readable medium according to claim 6, wherein the operations further comprise:

correcting the processing temperature and the processing time on a basis of the defect density distribution obtained by the calculating in a case where the defect density distribution obtained by the calculating does not satisfy a desired condition, and setting the processing temperature and the processing time after the correcting as the arguments of the arithmetic function.

* * * * *